United States Patent
Sato et al.

(10) Patent No.: US 10,594,970 B2
(45) Date of Patent: Mar. 17, 2020

(54) IMAGE SENSOR AND ELECTRONIC DEVICE

(71) Applicant: SONY CORPORATION, Tokyo (JP)

(72) Inventors: Gota Sato, Kanagawa (JP); Masashi Nakata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/580,153

(22) PCT Filed: Jun. 2, 2016

(86) PCT No.: PCT/JP2016/066420
§ 371 (c)(1),
(2) Date: Dec. 6, 2017

(87) PCT Pub. No.: WO2016/203974
PCT Pub. Date: Dec. 22, 2016

(65) Prior Publication Data
US 2018/0184036 A1    Jun. 28, 2018

(30) Foreign Application Priority Data
Jun. 15, 2015 (JP) .................................. 2015-119953

(51) Int. Cl.
*H04N 5/3745* (2011.01)
*H04N 5/374* (2011.01)
(Continued)

(52) U.S. Cl.
CPC .......... *H04N 5/37455* (2013.01); *G02B 7/34* (2013.01); *G02B 7/346* (2013.01);
(Continued)

(58) Field of Classification Search
CPC .......... H04N 5/36961; H04N 5/37455; H04N 5/37457; H04N 5/347; H04N 5/374;
(Continued)

(56) References Cited

U.S. PATENT DOCUMENTS

| 6,781,632 B1* | 8/2004 | Ide | G03B 13/00 250/201.2 |
| 2011/0080507 A1 | 4/2011 | Iwasa | |

(Continued)

FOREIGN PATENT DOCUMENTS

| JP | 2008-072470 A | 3/2008 |
| JP | 2011-078049 A | 4/2011 |

(Continued)

OTHER PUBLICATIONS

International Search Report and Written Opinion of PCT Application No. PCT/JP2016/066420, dated Aug. 9, 2016, 11 pages of ISRWO.

*Primary Examiner* — Lin Ye
*Assistant Examiner* — John H Morehead, III
(74) *Attorney, Agent, or Firm* — Chip Law Group

(57) ABSTRACT

The present disclosure relates to an image sensor and an electronic device that can reduce occurrence of a problem not only in a case of adding and using outputs of a plurality of PDs that share one of on-chip lenses but also in a case of using them individually. An image sensor according to a first aspect of the present disclosure includes: a light receiving element that generates charges by photoelectric conversion; an on-chip lens that is shared by a plurality of light receiving elements and condenses incident light onto the plurality of light receiving elements; and an AD convertor that converts charges generated by the light receiving element to a digital signal. Exposure timings of the plurality of light receiving elements sharing one of the on-chip lenses are the same. The present disclosure can be applied, for example, to image pickup devices having an image-plane phase-difference detection AF function.

12 Claims, 22 Drawing Sheets

(51) Int. Cl.
*H04N 5/347* (2011.01)
*H04N 5/369* (2011.01)
*G02B 7/34* (2006.01)
*H04N 9/04* (2006.01)
*H01L 27/146* (2006.01)
*G03B 13/36* (2006.01)

(52) U.S. Cl.
CPC .. *H01L 27/14627* (2013.01); *H01L 27/14641* (2013.01); *H01L 27/14656* (2013.01); *H04N 5/347* (2013.01); *H04N 5/36961* (2018.08); *H04N 5/374* (2013.01); *H04N 5/37457* (2013.01); *H04N 9/04557* (2018.08); *G03B 13/36* (2013.01); *H01L 27/14612* (2013.01); *H01L 27/14643* (2013.01)

(58) Field of Classification Search
CPC .......... H04N 9/04557; H01L 27/14656; H01L 27/14627; H01L 27/14641; H01L 27/14643; H01L 27/14612; G02B 7/346; G02B 7/34; G03B 13/36
See application file for complete search history.

(56) References Cited

U.S. PATENT DOCUMENTS

| | | | |
|---|---|---|---|
| 2013/0194471 A1* | 8/2013 | Yamashita | H04N 5/374 348/308 |
| 2013/0214128 A1 | 8/2013 | Yamashita et al. | |
| 2013/0229557 A1* | 9/2013 | Hashimoto | H04N 5/3745 348/301 |
| 2013/0307940 A1 | 11/2013 | Hirota | |
| 2015/0062102 A1* | 3/2015 | Ikeda | H04N 5/347 345/207 |
| 2015/0062394 A1* | 3/2015 | Ikeda | H04N 5/347 348/301 |
| 2015/0373251 A1* | 12/2015 | Haneda | H04N 5/23212 348/345 |

FOREIGN PATENT DOCUMENTS

| | | |
|---|---|---|
| JP | 2012-195921 A | 10/2012 |
| JP | 2013-172210 A | 9/2013 |
| JP | 2015-065624 A | 4/2015 |
| WO | 2012/117691 A1 | 9/2012 |

\* cited by examiner

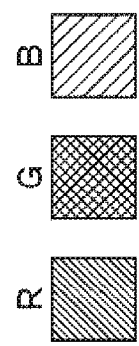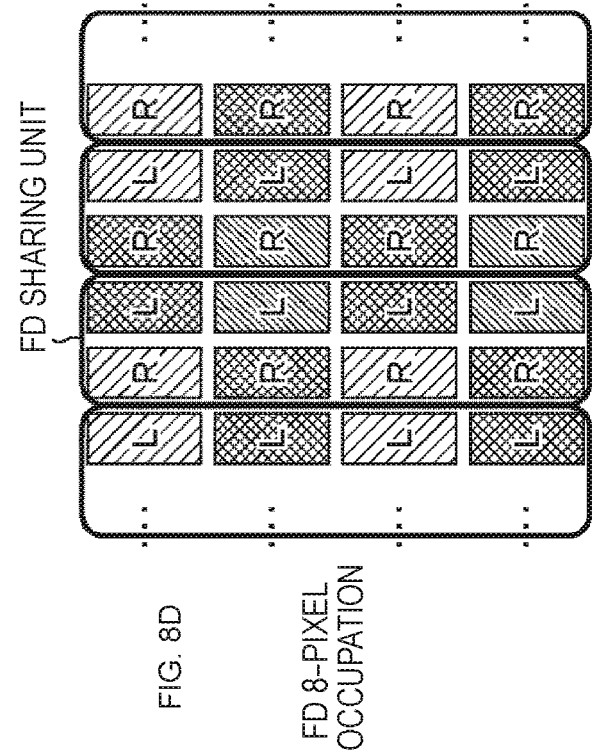
FIG. 8D
FD 8-PIXEL OCCUPATION
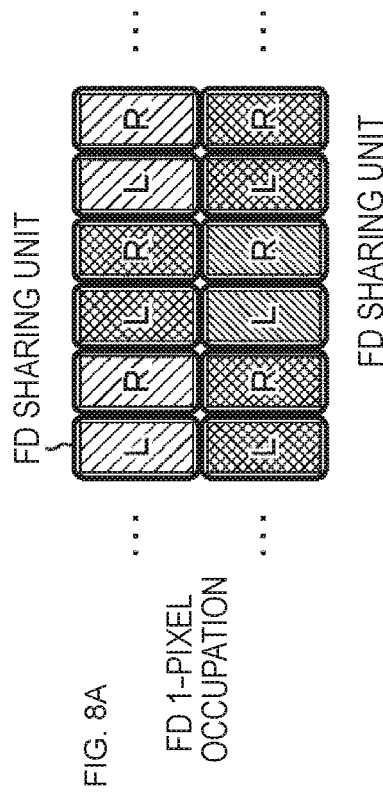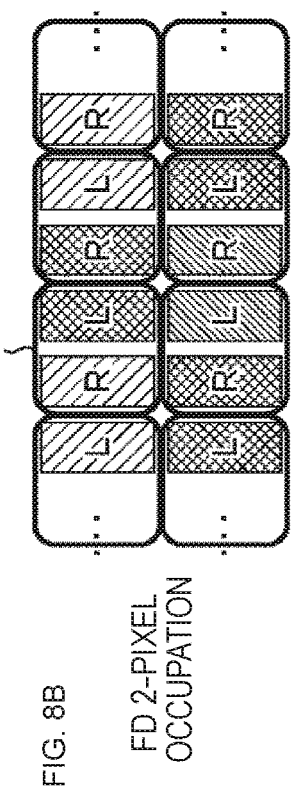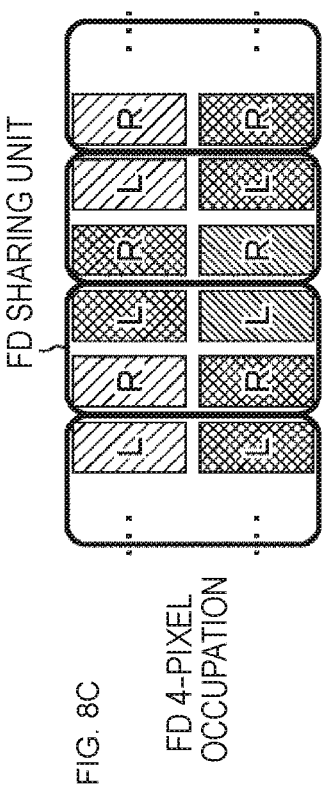
FIG. 8A
FD 1-PIXEL OCCUPATION
FIG. 8B
FD 2-PIXEL OCCUPATION
FIG. 8C
FD 4-PIXEL OCCUPATION

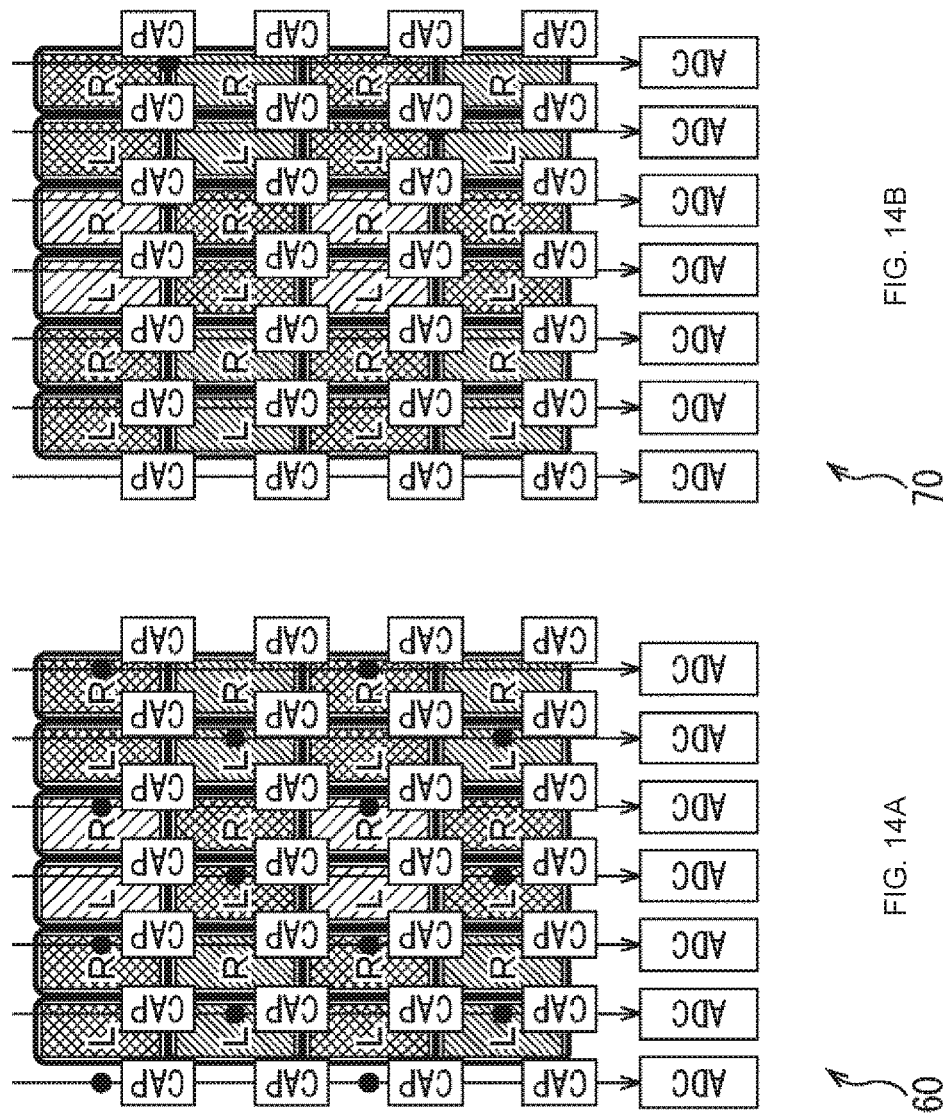

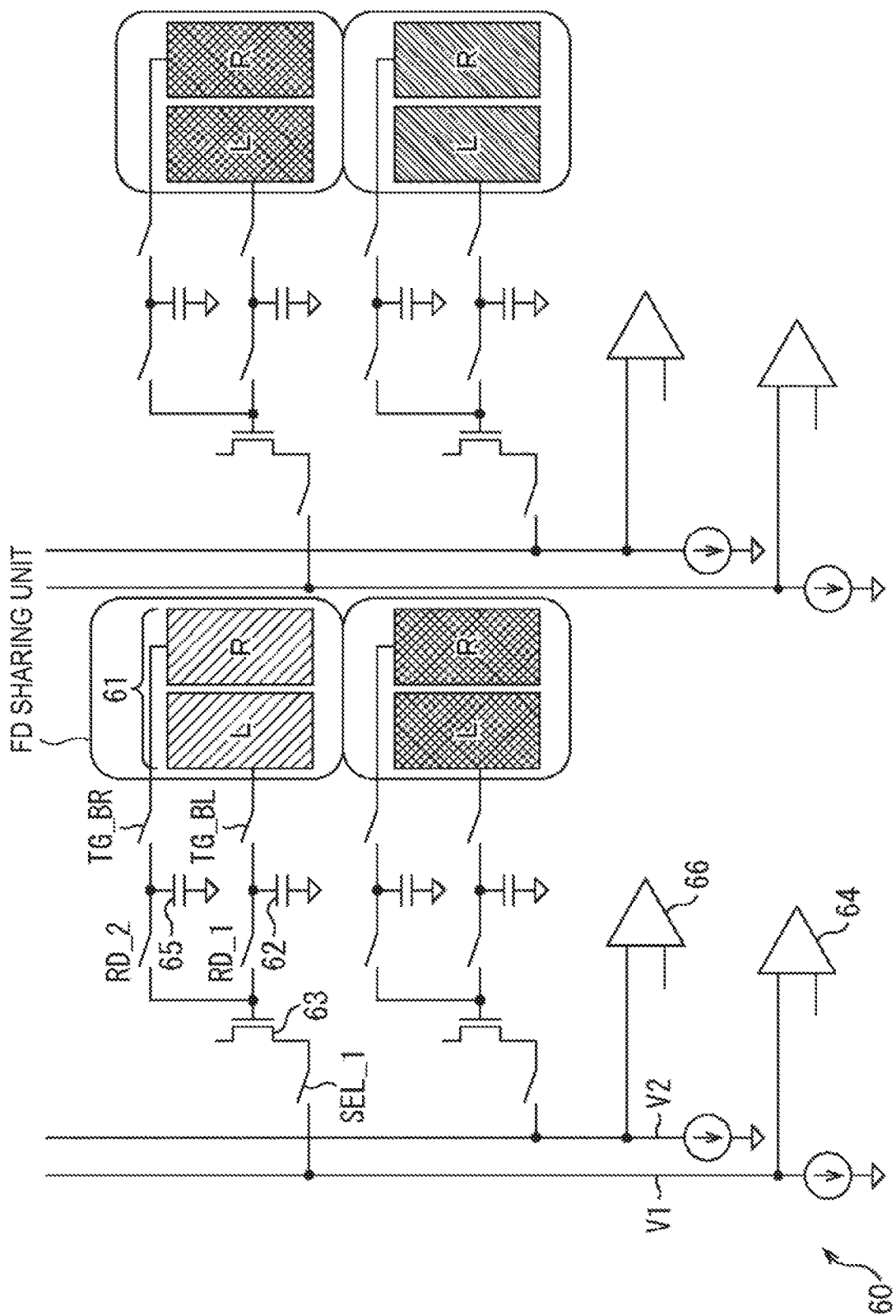

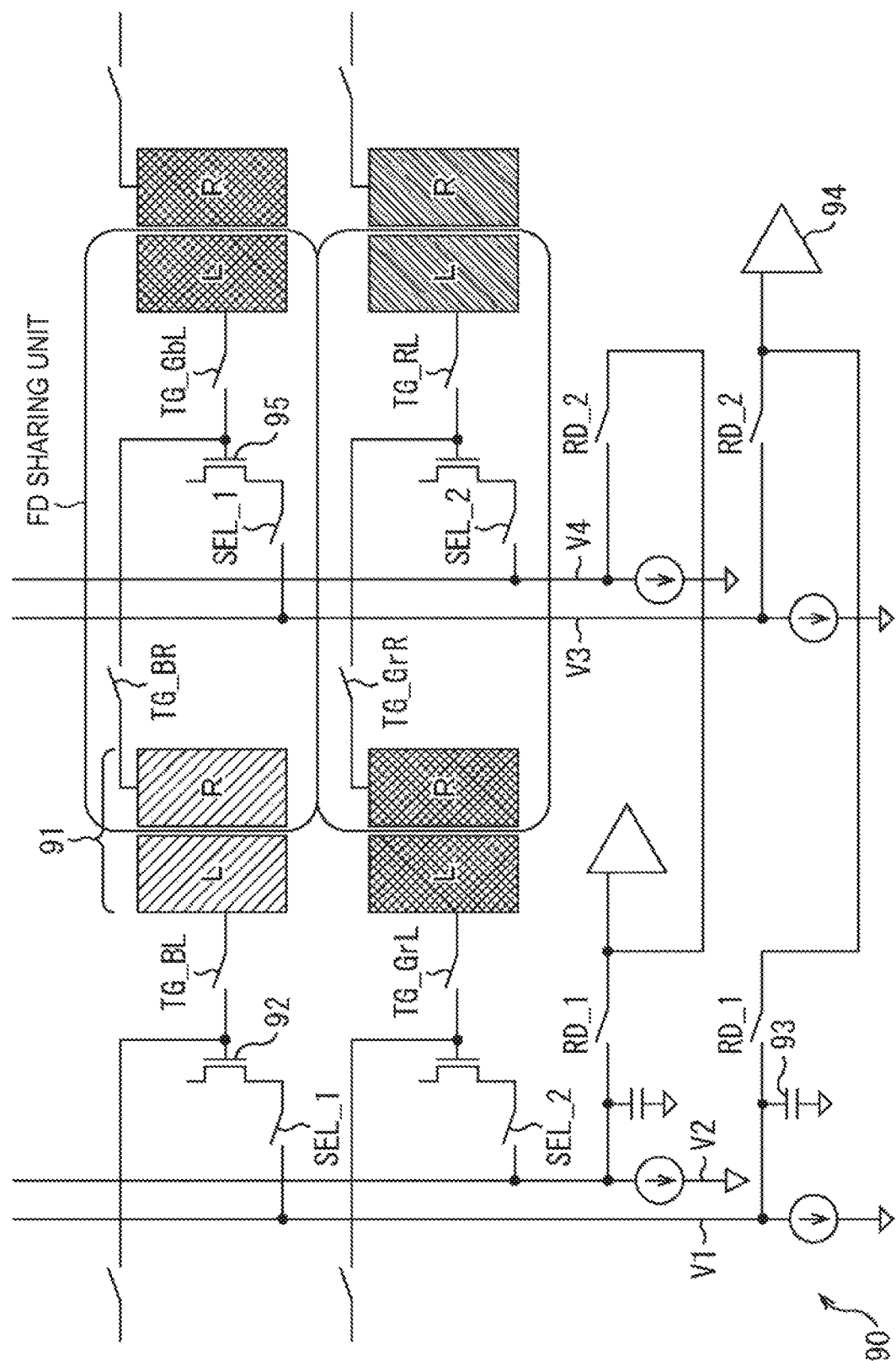

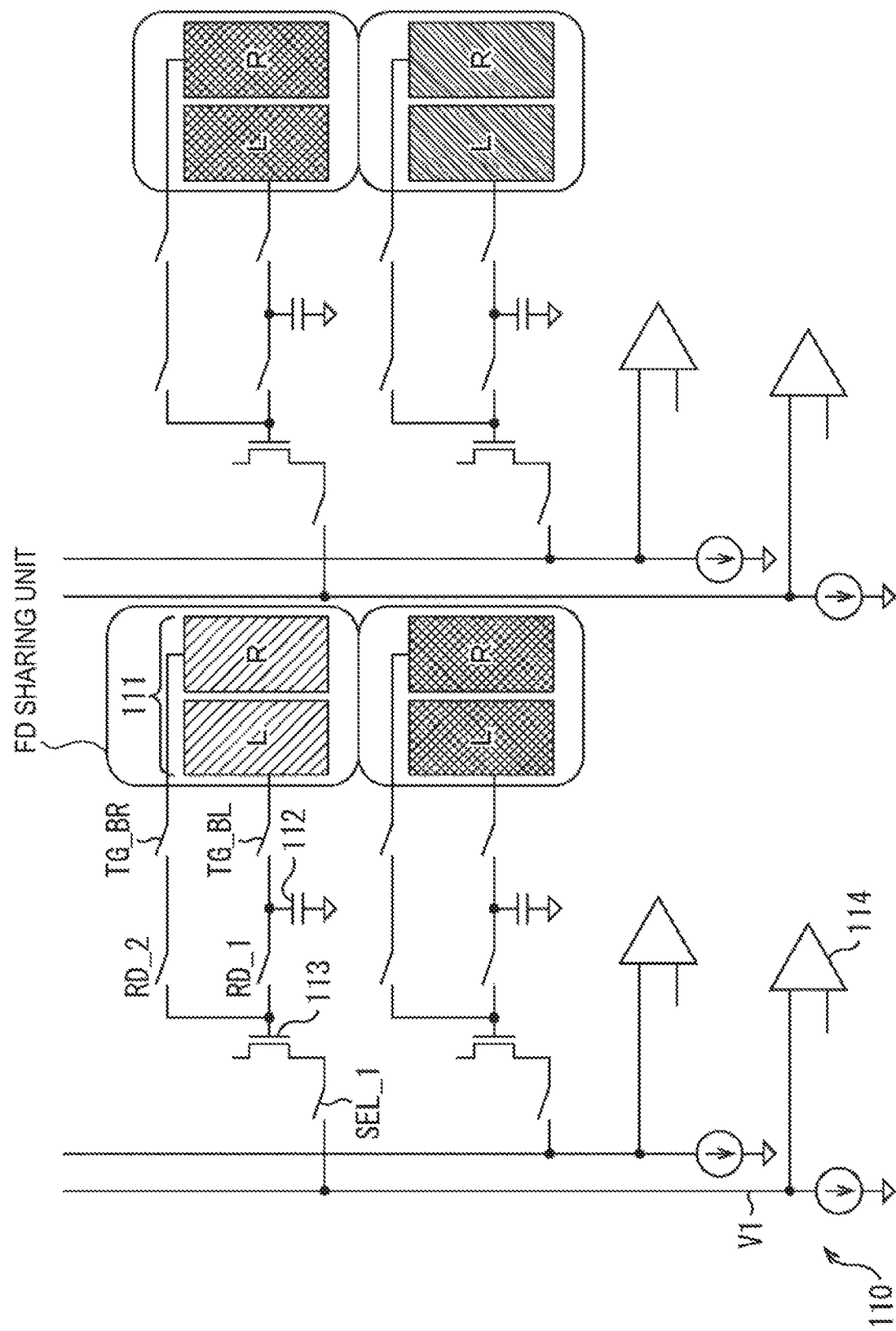

IMAGE SENSOR AND ELECTRONIC DEVICE

CROSS REFERENCE TO RELATED APPLICATIONS

This application is a U.S. National Phase of International Patent Application No. PCT/JP2016/066420 filed on Jun. 2, 2016, which claims priority benefit of Japanese Patent Application No. JP 2015-119953 filed in the Japan Patent Office on Jun. 15, 2015. Each of the above-referenced applications is hereby incorporated herein by reference in its entirety.

TECHNICAL FIELD

The present disclosure relates to an image sensor and an electronic device, and in particular, relates to an image sensor and an electronic device that are configured so as to share one on-chip lens by a plurality of photodiodes (PDs).

BACKGROUND ART

In the past, as a system of auto focus (AF) function of electronic devices, such as a digital camera on which an image sensor is mounted, an image-plane phase-difference AF has been known (for example, see Patent Literature 1). For an image sensor actualizing an image-plane phase-difference AF, a phase difference detection pixel for pupil-dividing incident light is arranged at a predetermined positon, in addition to a normal pixel for obtaining a pixel signal of an image.

A past phase difference detection pixel has a metal light shielding film with an opening that is shifted relative to the optical axis of an on-chip lens and is formed between the on-chip lens and PD, and is used only for an application of phase difference detection. Accordingly, in a case where a past phase difference detection pixel is arranged in an image sensor, a pixel signal used for an image cannot be obtained from the position.

Consequently, a structure in which one on-chip lens is shared by a plurality of PDs is proposed as a structure of a pixel whose output can be used not only for an application of phase difference detection but also for an application of pixel signal detection.

FIG. 1 shows a structure in which one on-chip lens 1 is shared by PD 2L and PD 2R that are laid out laterally, as an example of a structure in which one on-chip lens is shared by a plurality of PDs for the same color (that are covered with color filters of the same color or have sensitivity for the same color).

According to an image sensor in which pixels having such a structure are arranged, in a case where outputs from a plurality of PDs sharing one on-chip lens are added and used, it can be utilized as a pixel signal, and, in a case where the outputs from a plurality of PDs are used individually, it can be utilized for object trimming, dimension measurement, 3D data acquisition, refocusing and the like in addition to image-plane phase-difference AF.

However, in a case of a structure in which two PDs (PD 2L and PD 2R) share the on-chip lens 1 as shown in FIG. 1, if an object is out of focus, sensitivity difference is generated between the PD 2L and PD 2R. As the result, as shown in FIG. 2, there is a problem that nearity of the addition signal of both gets out of shape after the saturation of one of PD 2L and PD 2R. Meanwhile, L (Left) and R (Right) in FIG. 2 mean, respectively, charges that are generated in PD 2L and in RD 2R. The same is applied to subsequent drawings.

Consequently, according to an embodiment of the present disclosure, such a structure is adopted that a barrier between PD 2L and PD 2R is set to be low and, in a case where one of PD 2L and PD 2R is saturated, saturated charges flow out to the other, as shown in FIG. 3. This makes it possible to keep nearity of the addition signal of both even in a case where one of PD 2L and PD 2R has been saturated, as shown in FIG. 4.

CITATION LIST

Patent Literature

Patent Literature 1: JP 2007-304188A

DISCLOSURE OF INVENTION

Technical Problem

Next, there will be described exposure and readout timings of PD 2L and PD 2R in an image sensor having the structure in which PD 2L and PD 2R share the on-chip lens 1 as shown in FIG. 1 and, in a case where one of PD 2L and PD 2R is saturated, saturated charges flow out to the other as shown in FIG. 3.

FIG. 5 shows an example of timings of exposure start (shutter) and readout start (Read) of PD 2L and PD 2R of the image sensor.

In the case of FIG. 5, an exposure time is the same for PD 2L and PD 2R, but timings of the exposure start and the readout start of PD 2R are delayed by a predetermined time relative to those of PD 2L. In this case, there is no problem if each of PD 2L and PD 2R is not saturated, but, if PD 2R is saturated after PD 2L has been read out, the saturated charges flow out to the PD 2L side from which the readout has been finished and the corresponding charges are not read out in the end and are not reflected to the addition signal of both. Meanwhile, there is also the same problem in a case where the order of readout from PD 2L and PD 2R is revered.

FIG. 6 shows an example of timings of exposure start (shutter) and readout start (Read) of PD 2L and PD 2R of the image sensor, which is supposed in order to eliminate a problem that might have occurred in the case of FIG. 5.

In the case of FIG. 6, timings of exposure start of PD 2L and PD 2R coincide with each other, but the exposure of PD 2L is stopped after a time shorter than a predetermined exposure time and readout is performed. From PD 2R, readout is performed after the lapse of a predetermined exposure time. Moreover, after the readout from PD 2R, readout from PD 2L is performed again. Because of the control, even in a case where PD 2R is saturated after the readout from PD 2L and the saturated charges flow out to PD 2L side, the corresponding charges are read out and, therefore, the flown out charges can also be reflected to the addition signal of both.

However, in the case of FIG. 6, using outputs of both for an application of using them individually (such as phase difference detection) leads to deterioration of performance in the application (for example, phase difference detection performance), because exposure times of PD 2L and PD 2R are different. In particular, in a case where a predetermined exposure time is short, a degree of the effect becomes large.

The present disclosure has been achieved in consideration of the situation and can make it possible to reduce occurrence of a problem, by making exposure timings of a plurality of light receiving elements that share an on-chip lens coincide with each other, not only in a case of adding and using outputs of these but also in a case of using them individually.

Solution to Problem

An image sensor according to a first aspect of the present disclosure includes: a light receiving element that generates charges by photoelectric conversion; an on-chip lens that is shared by a plurality of light receiving elements and condenses incident light onto the plurality of light receiving elements; and an AD convertor that converts charges generated by the light receiving element to a digital signal. Exposure timings of the plurality of light receiving elements sharing one of the on-chip lenses are the same.

The image sensor according to the first aspect of the present disclosure can further include: an adder that adds charges that are generated by each of the plurality of light receiving elements sharing one of the on-chip lenses and supplies the added charges to the AD convertor.

Charges that are generated by each of the plurality of light receiving elements sharing one of the on-chip lenses can be converted simultaneously to digital signals by the AD convertors that are different.

The plurality of light receiving elements sharing one of the on-chip lenses can belong to different FD sharing units.

The AD convertor can be provided for every column.

The image sensor according to the first aspect of the present disclosure can further include: a plurality of holding units that hold charges generated by each of the plurality of light receiving elements sharing one of the on-chip lenses. Charges that are held in the plurality of holding units can be converted sequentially to digital signals by the AD convertor in common.

The plurality of light receiving elements sharing one of the on-chip lenses can belong to different FD sharing units.

The holding unit can be provided for every column. The AD convertor can be provided for every other column.

The plurality of light receiving elements sharing one of the on-chip lenses can belong to a same FD sharing unit.

The holding unit can be provided for every light receiving element. The AD convertor can be provided for every column.

The image sensor according to the first aspect of the present disclosure can further include: a holding unit that holds charges generated by the plurality of light receiving elements sharing one of the on-chip lenses. Charges generated by each of the plurality of light receiving elements sharing one of the on-chip lenses and charges held in the holding unit are converted sequentially to digital signals by the AD convertor in common.

The image sensor according to the first aspect of the present disclosure can further include: a holding unit that holds charges generated by one of a light receiving element pair sharing one of the on-chip lenses. Charges generated by one of the light receiving element pair, and charges generated by the other of the light receiving element pair and held in the holding unit can be converted sequentially to digital signals by the AD convertor in common.

The plurality of light receiving elements sharing one of the on-chip lenses can belong to different FD sharing units.

The holding unit can be provided for every other column. The AD convertor can be provided for every other column.

The plurality of light receiving elements sharing one of the on-chip lenses can belong to the same FD sharing unit.

The holding unit can be provided for every FD sharing unit. The AD convertor can be provided for every column.

An image sensor according to a second aspect of the present disclosure includes, in an electronic device on which the image sensor is mounted, a light receiving element that generates charges by photoelectric conversion, an on-chip lens that is shared by a plurality of light receiving elements and condenses incident light onto the plurality of light receiving elements, and an AD convertor that converts charges generated by the light receiving element to a digital signal. Exposure timings of the plurality of light receiving elements sharing one of the on-chip lenses are the same.

In the first and second aspects of the present disclosure, exposure timings of a plurality of light receiving elements that share an on-chip lens are controlled so as to be the same, and charges generated by the light receiving elements are converted to digital signals.

Advantageous Effects of Invention

According to the first and second aspects of the present disclosure, occurrence of a problem can be reduced not only in the case of adding and using outputs of a plurality of light receiving elements that share one on-chip lens but also in the case of using them individually.

BRIEF DESCRIPTION OF DRAWINGS

FIGS. 8A, 8B, 8C, and 8D are diagrams showing an example of FD sharing.

FIGS. 14A and 14B are diagrams showing a configuration example of an image sensor in which FD sharing is combined with Case 2.

FIG. 17 is a circuit diagram showing another configuration example of an image sensor in which FD 2-pixel sharing is combined with Case 2.

FIG. 20 is a circuit diagram showing a configuration example of an image sensor in which FD 2-pixel sharing is combined with Case 3.

FIG. 21 is a circuit diagram showing another configuration example of an image sensor in which FD 2-pixel sharing is combined with Case 3.

MODE(S) FOR CARRYING OUT THE INVENTION

Hereinafter, preferred forms for practicing the present disclosure (hereinafter, called embodiments) will be described in detail with reference to the drawings.
<Outline of Image Sensors to which the Present Disclosure is Applied>

Figure 1:
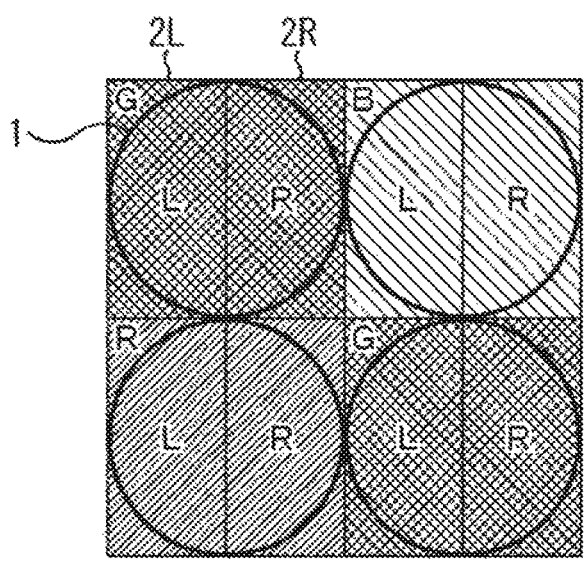
FIG. 1 is a diagram showing an example of a structure in which an on-chip lens is shared by a plurality of PDs of the same color.
Figure 2:
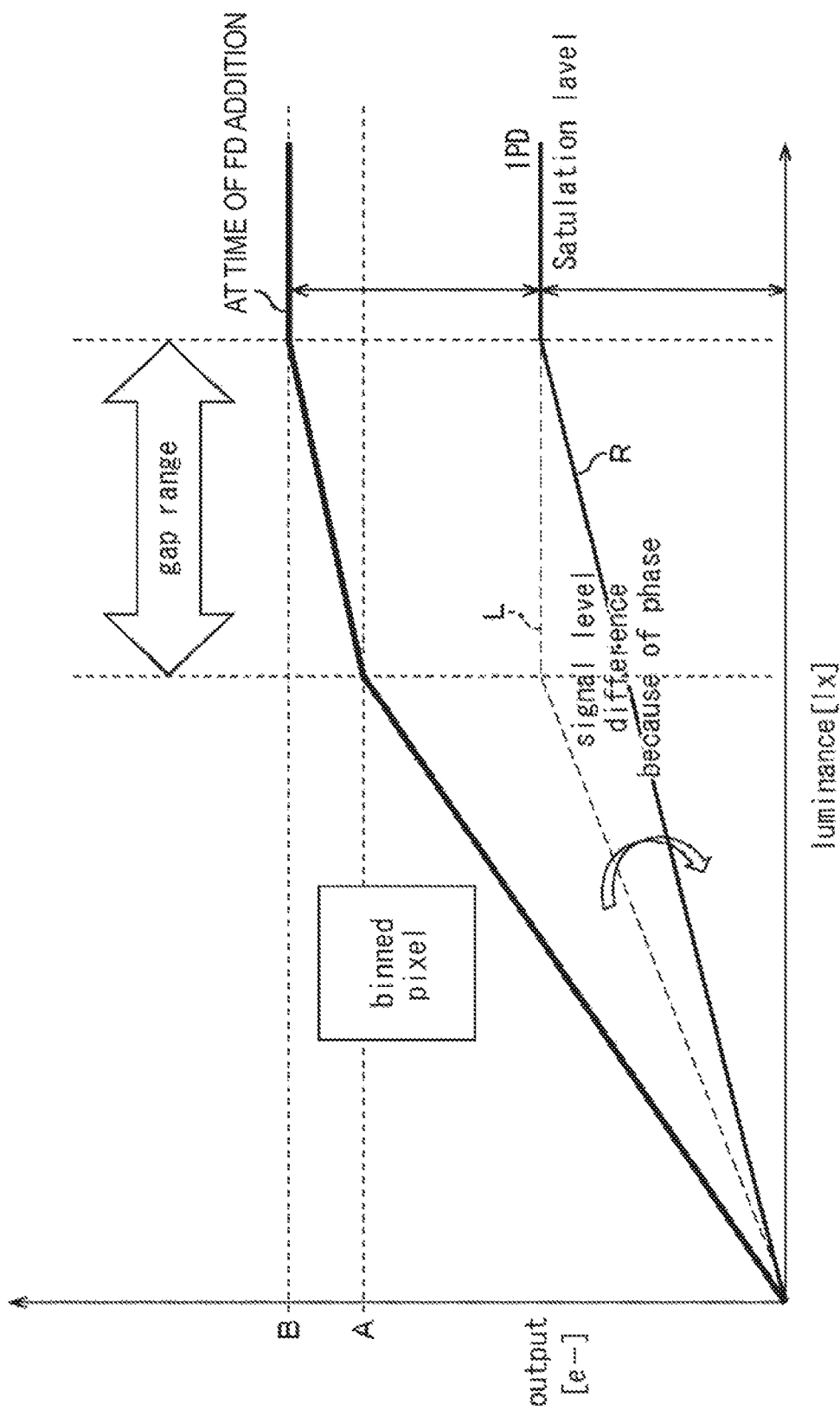
FIG. 2 is a diagram for describing a problem of an addition signal obtained by adding outputs of a plurality of PDs of the same color.
Figure 3:
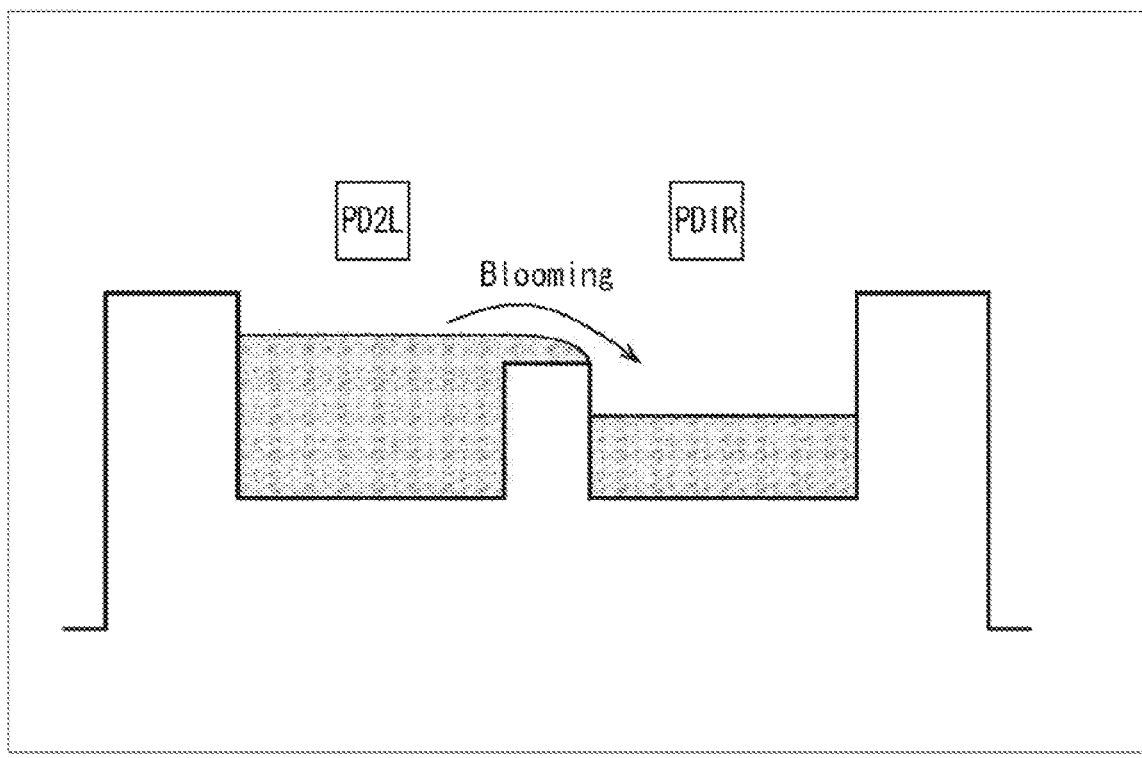
FIG. 3 is a diagram showing a structure for solving the problem as described in FIG. 2.
Figure 4:
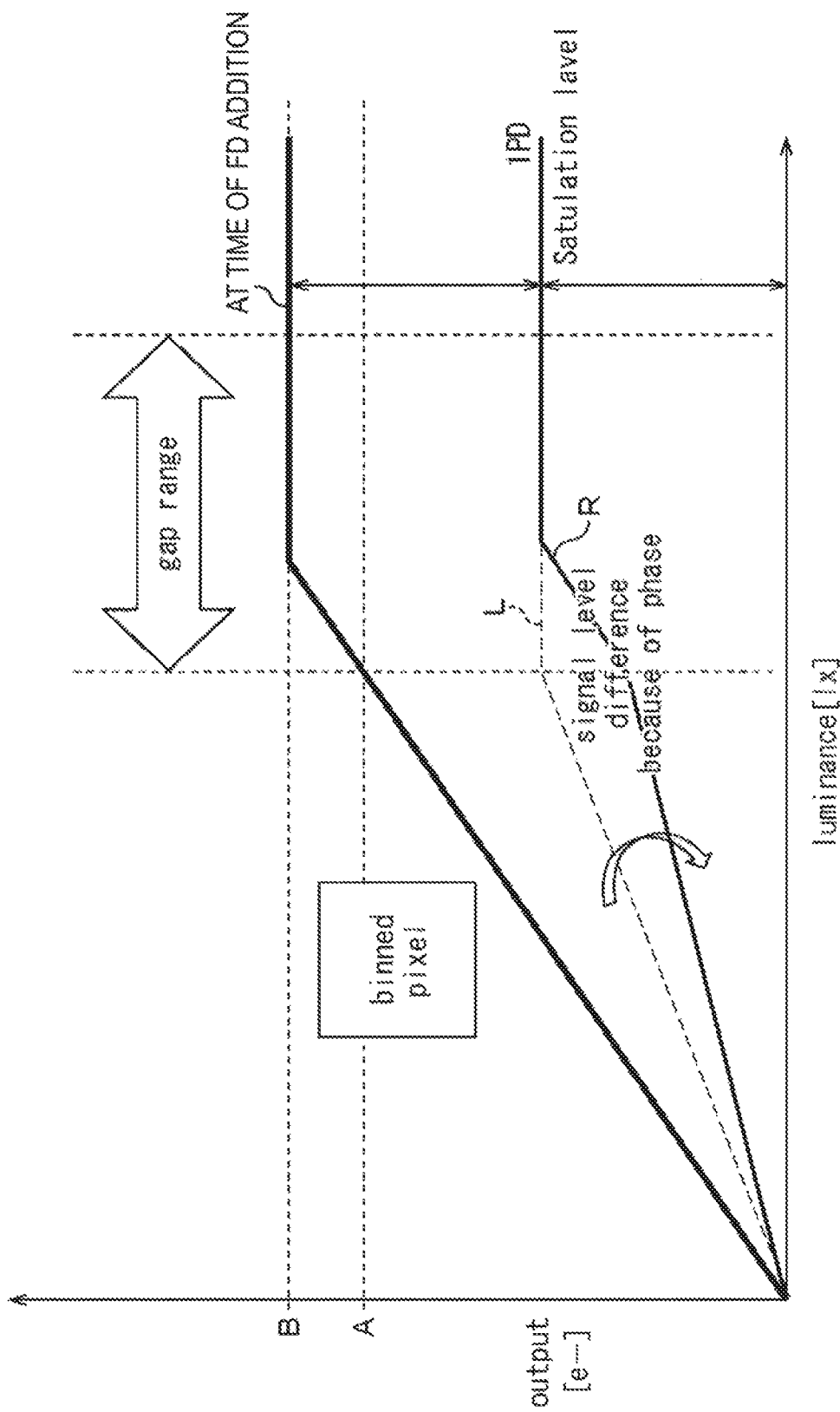
FIG. 4 is a diagram for describing a state where the problem as described in FIG. 2 is solved.
Figure 5:
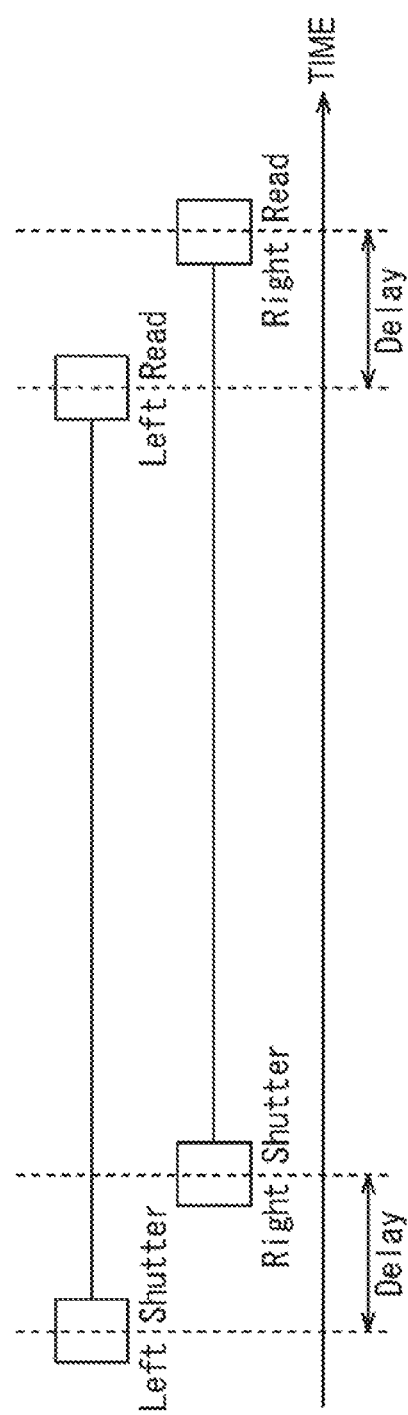
FIG. 5 is a diagram showing an example of exposure and readout timings of two PDs that share an on-chip lens.
Figure 6:
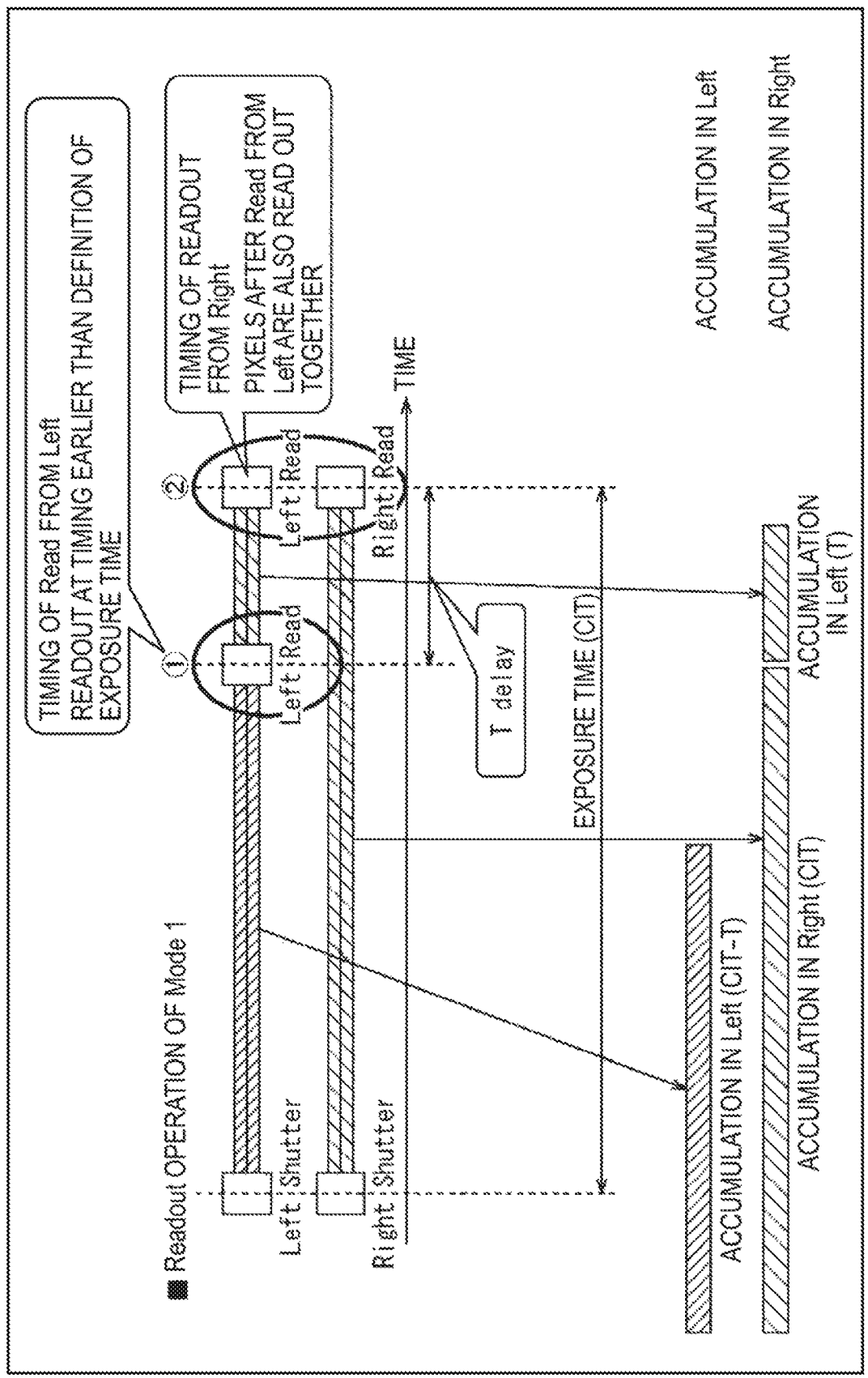
FIG. 6 is a diagram showing another example of exposure and readout timings of two PDs that share an on-chip lens.
Figure 7A:
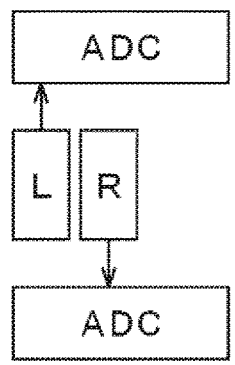
FIGS. 7A, 7B, and 7C are diagrams for describing an outline of an image sensor to which the present disclosure is applied.
Figure 7B:
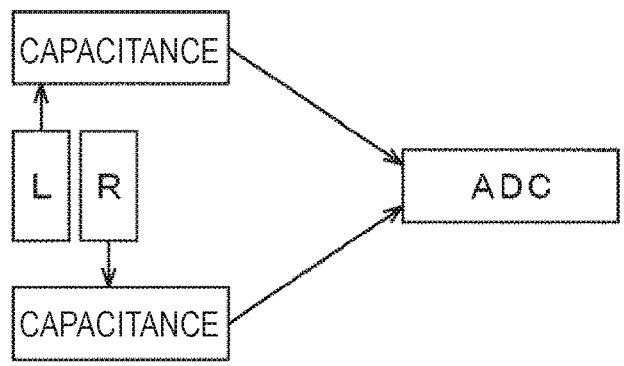
Figure 7C:
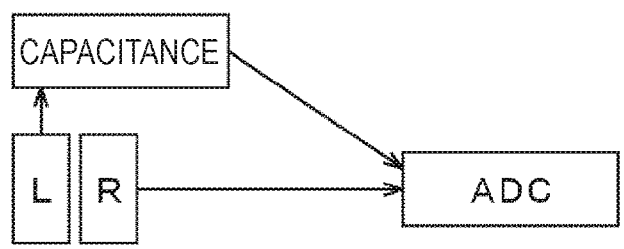

FIGS. 7A, 7B, and 7C are diagrams for describing an outline of an image sensor to which the present disclosure is applied. The image sensor to which the present disclosure is applied is classified into Case 1 to Case 3 to be described below.

FIG. 7A shows the configuration of Case 1. Case 1 has a configuration in which an analog-digital converter (ADC) is provided for every column and each of two PDs of the same color (L and R in the diagram) that share one on-chip lens is connected with a different ADC to enable simultaneous readout of both (coincidence of timings of exposure start and readout).

FIG. 7B shows the configuration of Case 2. Case 2 has a configuration in which a capacitance is prepared for each of two PDs of the same color (L and R in the diagram) that share one on-chip lens to make substantially simultaneous readout of both possible.

FIG. 7C shows the configuration of Case 3. Case 3 has a configuration in which a capacitance is prepared for only one (in the case of FIG. 7C, L) of two PDs of the same color (L and R in the diagram) that share one on-chip lens to enable the simultaneous exposure and sequential readout (substantially simultaneous readout) of both by performing simultaneously the output from L to the capacitance and the output from R to an ADC and, subsequently, performing the output from the capacitance to the ADC.

Meanwhile, in the above-described Cases 1 to 3, a light receiving element other than a PD may be used.
<Examples of Floating Diffusion (FD) Sharing>

Next, FIGS. 8A, 8B, 8C and 8D shows an example of FD sharing in an image sensor to which the present disclosure is applied.

FIG. 8A shows an example of a case of occupying one pixel by one FD, instead of sharing an FD by a plurality of pixels (PDs). Hereinafter, the case is called FD 1-pixel occupation.

FIG. 8B shows an example of a case of sharing an FD by two pixels (PDs). Hereinafter, the case is called FD 2-pixel sharing. FIG. 8C shows an example of a case of sharing an FD by four pixels (PDs). Hereinafter, the case is called FD 4-pixel sharing. FIG. 8D shows an example of a case of sharing an FD by eight pixels (PDs). Hereinafter, the case is called FD 8-pixel sharing.

Meanwhile, the number of pixels that share an FD in the image sensor to which the present disclosure is applied is not limited to the above-described examples but design is possible with an arbitrary number.
<Configuration Example in Case 1>

Figure 9C:
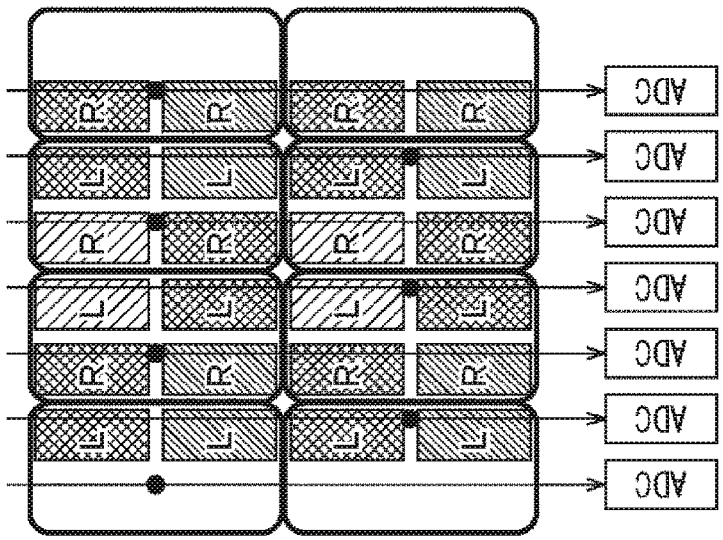
FIGS. 9A, 9B, and 9C are diagrams showing a configuration example of an image sensor in which FD sharing is combined with Case 1.
Figure 9B:
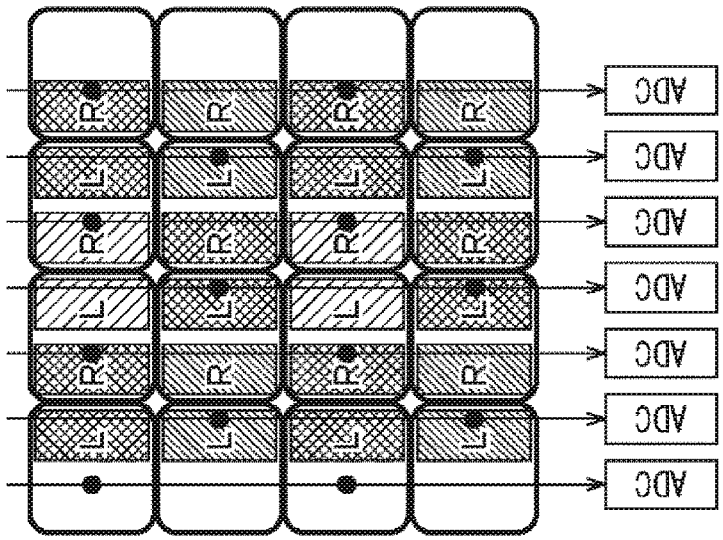
Figure 9A:
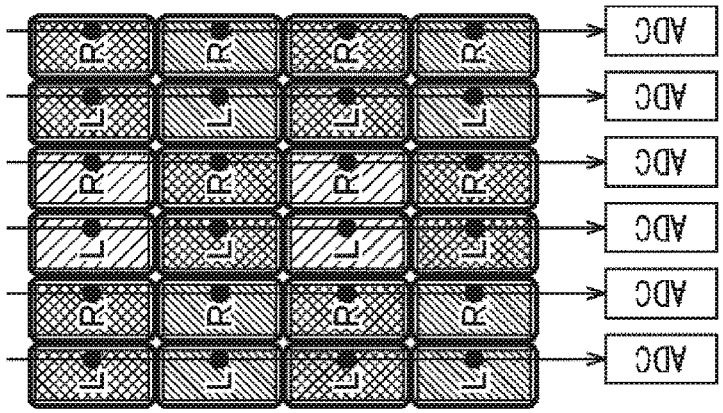

FIGS. 9A, 9B, and 9C shows configuration examples of image sensors in which FD sharing is combined with Case 1 shown in FIG. 7A.

FIG. 9A is a configuration example of an image sensor in which the FD 1-pixel occupation is combined with Case 1. Hereinafter, it is called an image sensor 10. FIG. 9B is a configuration example of an image sensor in which the FD 2-pixel sharing is combined with Case 1. Hereinafter, it is called an image sensor 20. FIG. 9C is a configuration example of an image sensor in which the FD 4-pixel sharing is combined with Case 1. Hereinafter, it is called an image sensor 30.

Figure 10:
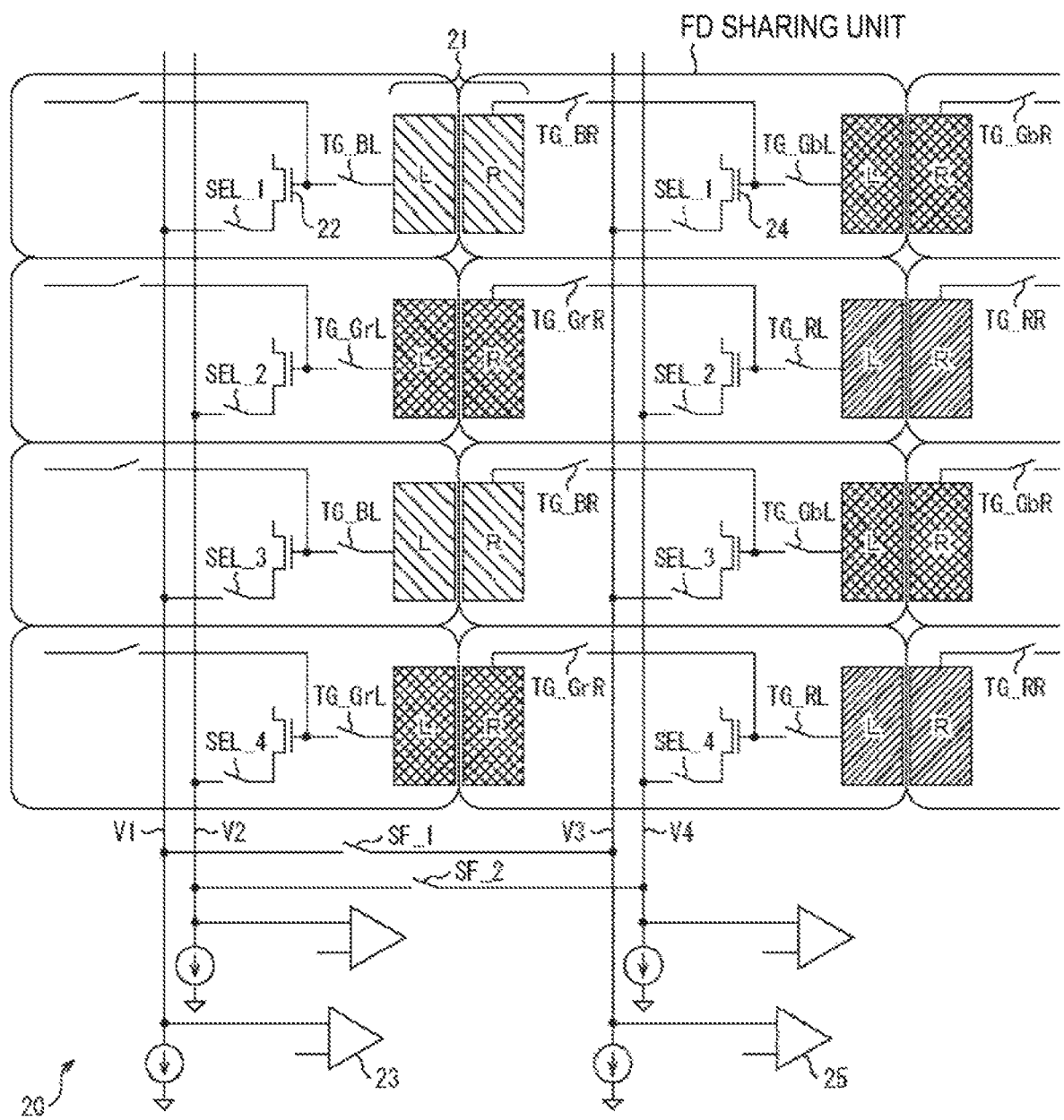
FIG. 10 is a circuit diagram showing a configuration example of an image sensor in which FD 2-pixel sharing is combined with Case 1.

FIG. 10 is a circuit diagram showing a configuration example of the image sensor 20 in which the FD 2-pixel sharing is combined with Case 1.

When attention is paid to two B (BLUE) pixels (PDs) that are arranged in the first row from the top on the left side in FIG. 10 and share an on-chip lens, a pixel pair 21 belongs to different FD sharing units and L of the pixel pair 21 is connected to a vertical signal line V1 that is linked to an ADC 23 via a switch TG_BL, an FD 22, and a switch SEL_1. R of the pixel pair 21 is connected to a vertical signal line V3 that is linked to an ADC 25 via a switch TG_BR, an FD 24, and a switch SEL_1. Meanwhile, the vertical signal line V1 is connected with the vertical signal line V3 via a switch SF_1.

Figure 11:
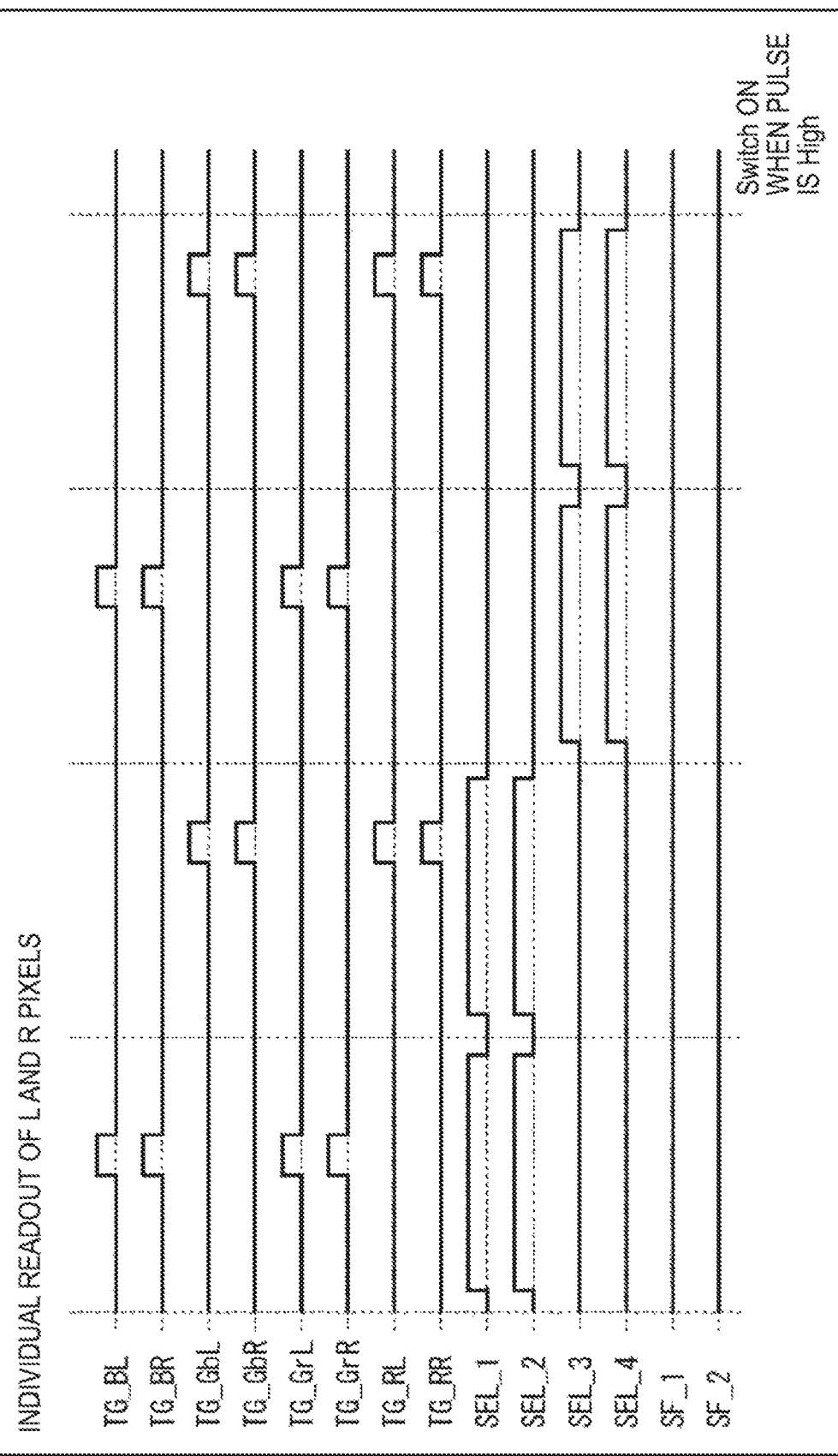
FIG. 11 shows a timing chart corresponding to individual readout of a pixel pair by the image sensor in FIG. 10.

FIG. 11 shows a timing chart in a case where charges are read out individually (without addition) from the pixel pair of the same color that shares an on-chip lens, in the image sensor 20 shown in FIG. 10.

In the image sensor 20 in FIG. 10, charges are read out simultaneously from L and R of the pixel pair 21 of the same color that share an on-chip lens in a case where the switches TG_BL and TG_BR are simultaneously turned on in a state where the switch SF_1 that links the vertical signal lines V1 and V3 is turned off and the switch SEL_1 is turned on. Meanwhile, readout is performed alternately from each of pixels that share an FD. That is, it is possible to read out simultaneously charges from L and R of the pixel pair 21 of the same color that share an on-chip lens, and to output these individually.

Figure 12:
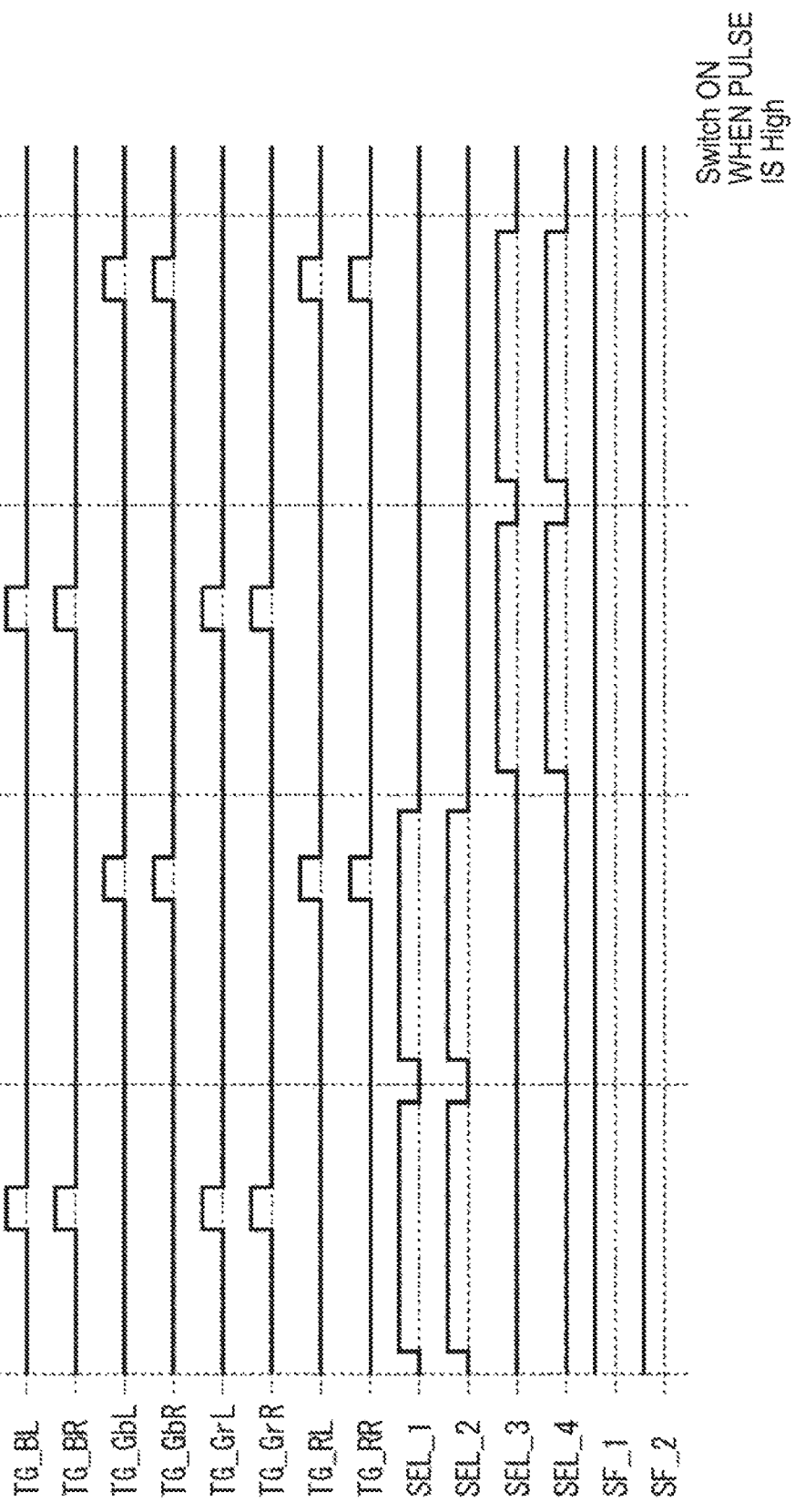
FIG. 12 shows a timing chart corresponding to addition readout of pixel pairs by the image sensor in FIG. 10.

FIG. 12 shows a timing chart in a case where charges are added and read out from a pixel pair of the same color that shares an on-chip lens, in the image sensor 20 shown in FIG. 10.

In the image sensor 20 in FIG. 10, charges are read out simultaneously from L and R of the pixel pair 21 that shares an on-chip lens and are added and output in a case where the switches TG_BL and TG_BR are simultaneously turned on in a state where the switch SF_1 that links the vertical signal lines V1 and V3 is turned on and the switch SEL_1 is turned on. That is, it is possible to read out simultaneously charges from L and R of the pixel pair 21 of the same color that shares an on-chip lens, and to add and output them.

<Configuration Example in Case 2>

FIGS. 13A, 13B, 13C, 14A, and 14B show configuration examples of image sensors in which FD sharing is combined with Case 2 shown in FIG. 7B.

Figure 13C:
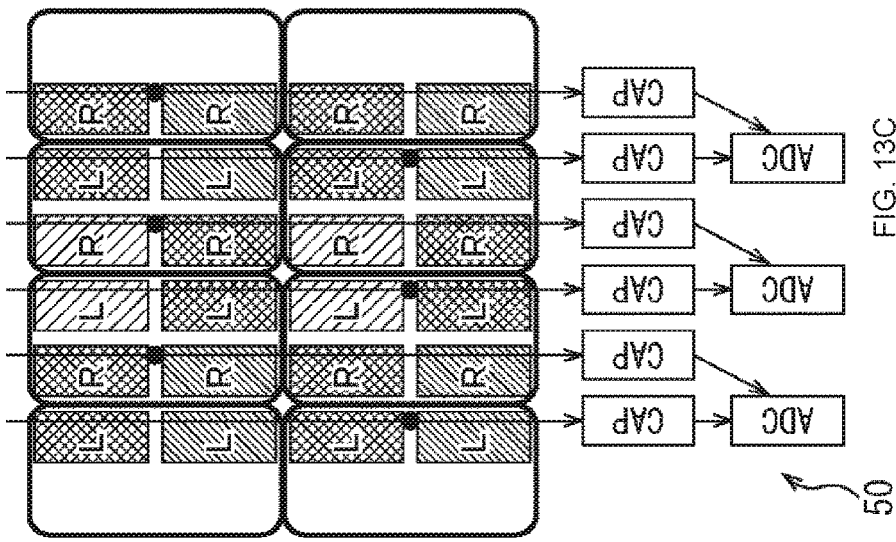
FIGS. 13A, 13B, and 13C are diagrams showing a configuration example of an image sensor in which FD sharing is combined with Case 2.
Figure 13B:
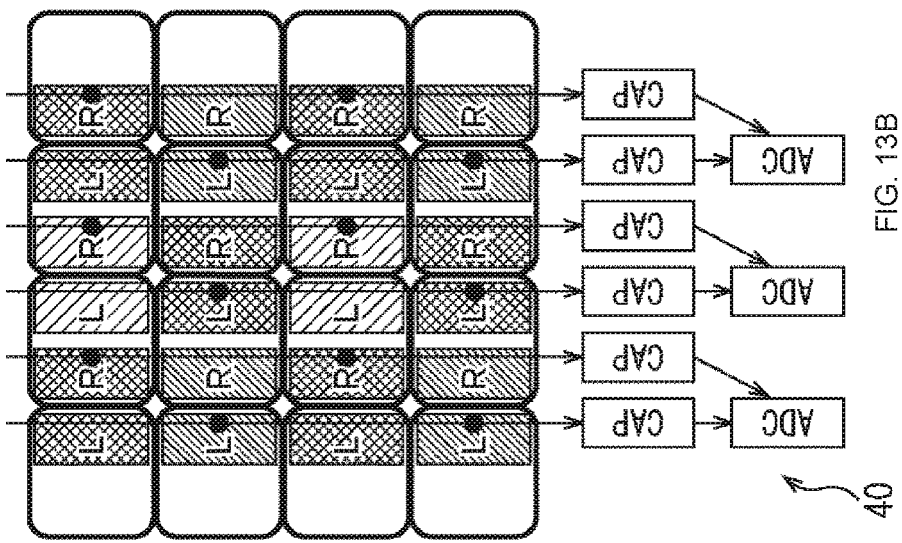
Figure 13A:
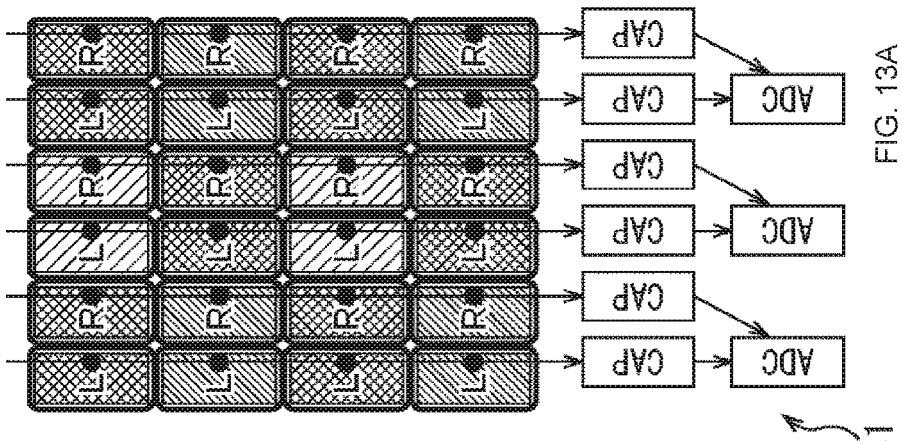

FIG. 13A is a configuration example of an image sensor in which the FD 1-pixel occupation is combined with Case 2 and a capacitance is arranged for every column, and an ADC is arranged for every two columns. Hereinafter, it is called an image sensor 31. FIG. 13B is a configuration example of an image sensor in which the FD 2-pixel sharing is combined with Case 2 and a capacitance is arranged for every column, and an ADC is arranged for every two columns. Hereinafter, it is called an image sensor 40. FIG. 13C is a configuration example of an image sensor in which the FD 4-pixel sharing is combined with Case 2 and a capacitance is arranged for every column, and an ADC is arranged for every two columns. Hereinafter, it is called an image sensor 50.

FIG. 14A is a configuration example of an image sensor in which a case of sharing an on-chip lens and an FD by two pixels is combined with Case 2 and a capacitance is arranged for every pixel, and an ADC is arranged for every column. Hereinafter, it is called an image sensor 60. FIG. 14B is a configuration example of an image sensor in which a case of sharing an FD by two sets of a pixel pair that shares an on-chip lens is combined with Case 2 and a capacitance is arranged for every pixel, and an ADC is arranged for every column. Hereinafter, it is called an image sensor 70.

Figure 15:
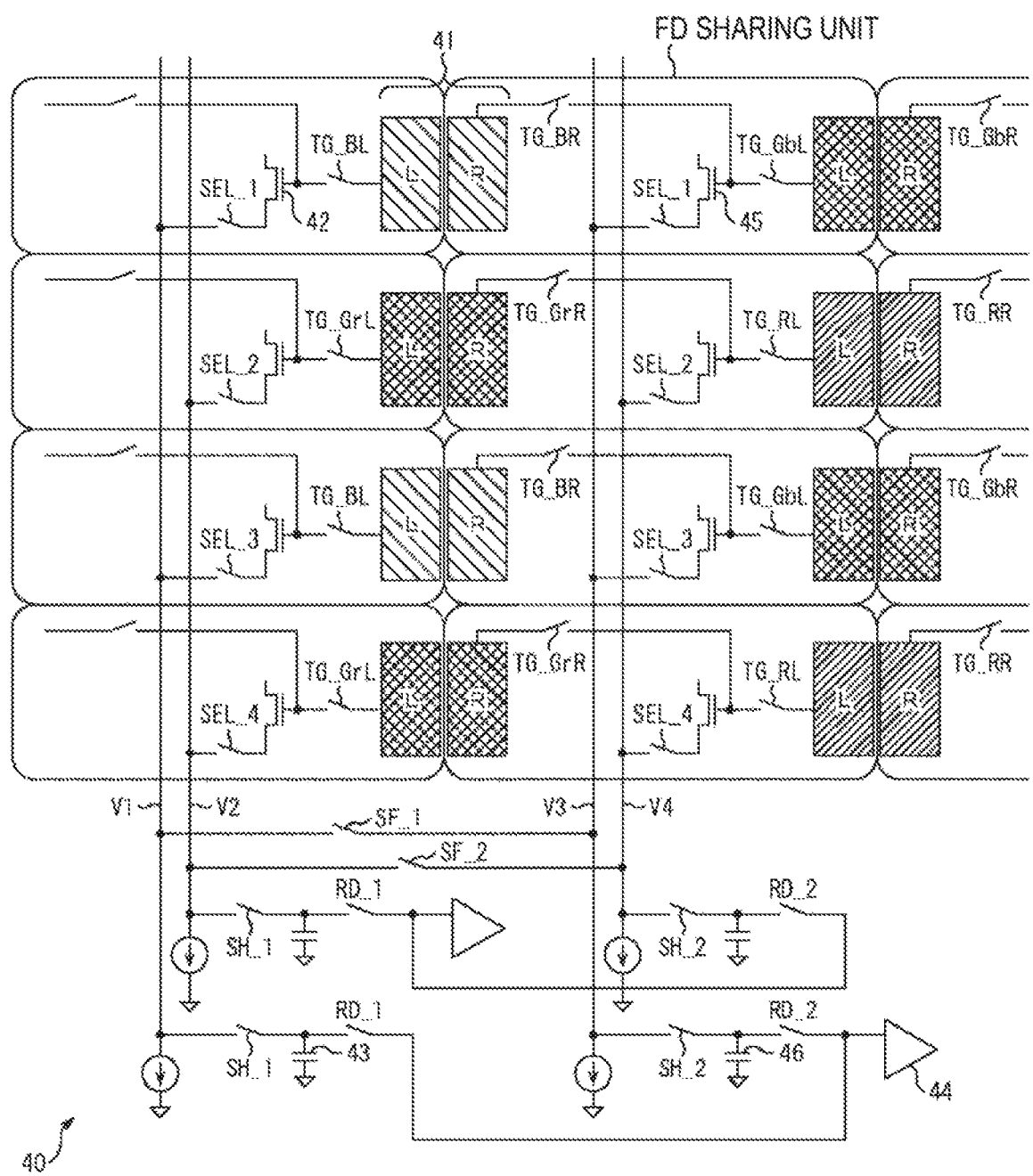
FIG. 15 is a circuit diagram showing a configuration example of an image sensor in which FD 2-pixel sharing is combined with Case 2.

FIG. 15 is a circuit diagram showing a configuration example of the image sensor 40 in which the FD 2-pixel sharing is combined with Case 2.

When attention is paid to two B (BLUE) pixels (PDs) that are arranged in the first row from the top on the left side in FIG. 15 and share an on-chip lens, a pixel pair 41 belongs to different FD sharing units and L of the pixel pair 41 is connected to the vertical signal line V1 via the switch TG_BL, an FD 42, and the switch SEL_1. To the vertical signal line V1, a capacitance 43 is connected via a switch SH_1, and, to the capacitance 43, an ADC 44 is connected via a switch RD_1. R of the pixel pair 41 is connected to the vertical signal line V3 via the switch TG_BR, an FD 45, and the switch SEL_1. To the vertical signal line V3, a capacitance 46 is connected via a switch SH_2, and, to the capacitance 46, the ADC 44 that is shared by the vertical signal line V1 is connected via a switch RD_2. Meanwhile, the vertical signal line V1 is connected with the vertical signal line V3 via the switch SF_1.

Figure 16:
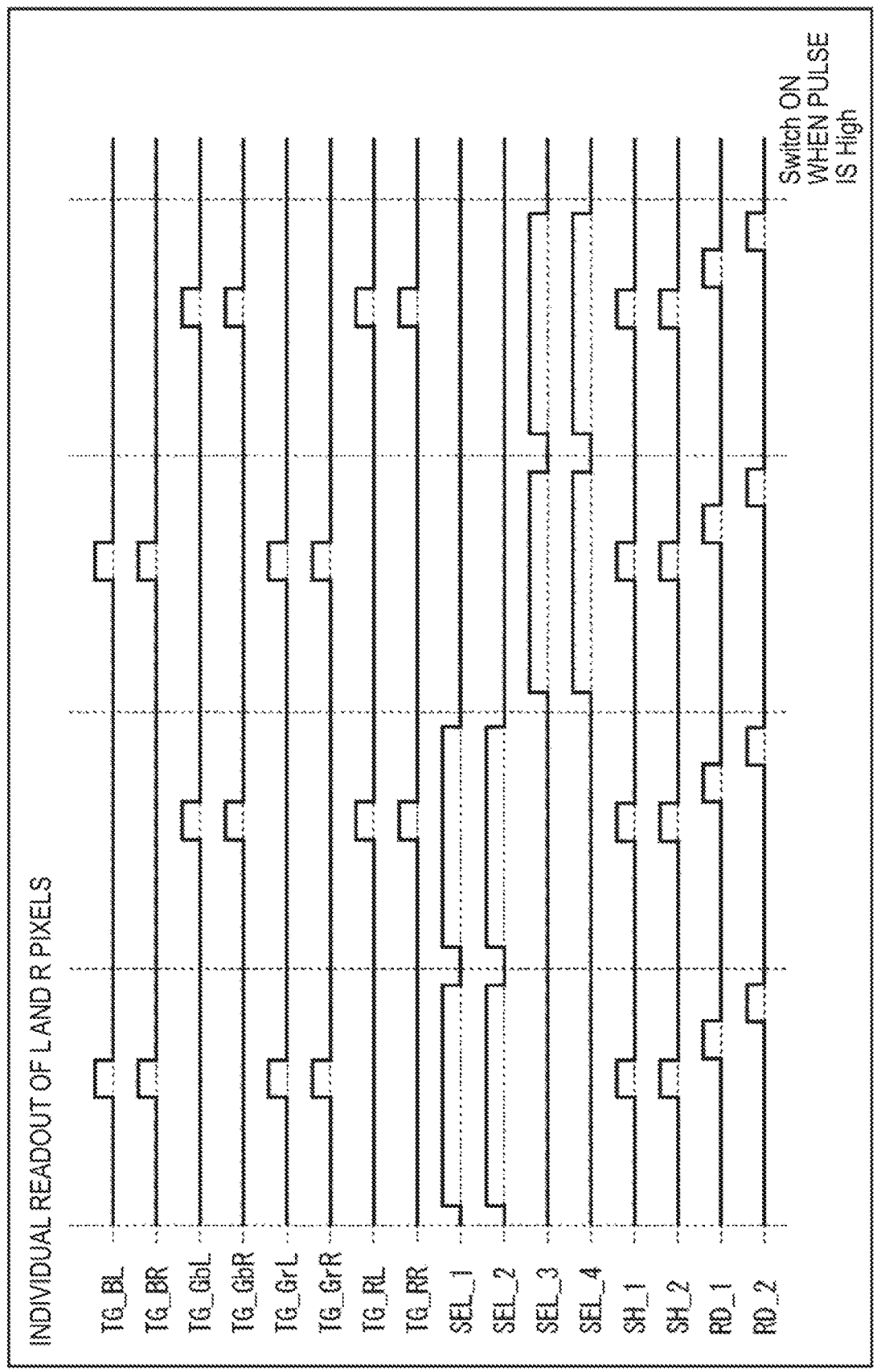
FIG. 16 shows a timing chart corresponding to the image sensor in FIG. 15.

FIG. 16 shows a timing chart in a case where charges are read out individually (without addition) from a pixel pair of the same color that shares an on-chip lens in the image sensor 40 shown in FIG. 15.

Charges are read out simultaneously from L and R of the pixel pair 41 if each of switches is controlled according to FIG. 16 in a state where the switch SF_1 that links the vertical signal lines V1 and V3 is turned off (not shown), are, respectively, transferred to and held by the capacitance 43 or 46, and, after that, can be read out and output sequentially. Moreover, it is known that readout from pixels that share FD is performed alternately.

Meanwhile, the image sensor 40 can read out simultaneously charges from L and R of the pixel pair 41 to hold the charges in the same capacitance (capacitance 42 or 46) and output the held charges if the switch SF_1 that links the vertical signal lines V1 and V3 is turned on, that is, can add and output charges from the pixel pair 41, although illustration of the timing chart is omitted.

FIG. 17 is a circuit diagram showing a configuration example of the image sensor 60 in which a case of sharing an on-chip lens and an FD by two pixels is combined with Case 2 and a capacitance is arranged for every pixel and an ADC is arranged for every column.

When attention is paid to two B (BLUE) pixels (PDs) that are arranged in the first row from the top on the left side in FIG. 17 and share an on-chip lens and an FD, L of a pixel pair 61 is connected to the vertical signal line V1 via the switch TG_BL, a capacitance 62, the switch RD_1, an FD 63 and the switch SEL_1. An ADC 64 is connected to the vertical signal line V1. R of the pixel pair 61 is also connected to the vertical signal line V1 via the switch TG_BR, a capacitance 65, the switch RD_2, the FD 63 and the switch SEL_1.

In the image sensor 70 shown in FIG. 17, it is possible to read out simultaneously charges from L and R of the pixel pair 61 and to hold the charges, respectively, in the different capacitance 62 or 65, by turning on simultaneously the switches TG_BR and TG_BL, and to read out and output charges that are read out from L of the pixel pair 61 and held in the capacitance 62, by turning on the switch RD_1 and turning off the switch RD_2. Next, by turning off the switch RD_1 and turning on the switch RD_2, it is possible to read out and output charges that are read out from R of the pixel pair 61 and held in the capacitance 65. Meanwhile, it is also possible to add and output charges that are read out from the pixel pair 61 and held in the capacitances 62 and 65.

<Configuration Example in Case 3>

FIGS. 18A, 18B, 18C, 19A, and 19B show a configuration example of an image sensor in which FD sharing is combined with Case 3 shown in FIG. 7C.

Figure 18A:
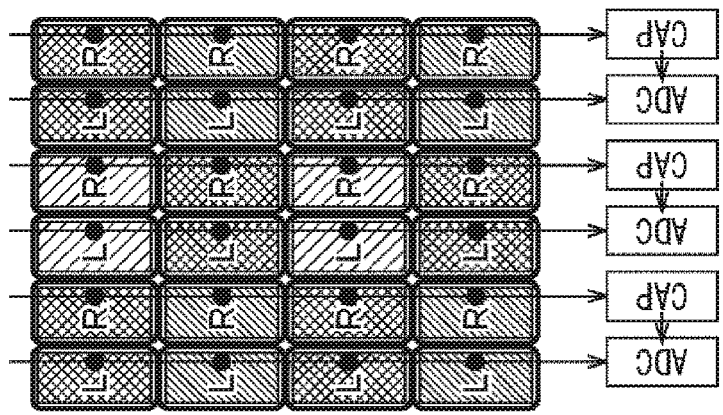
FIGS. 18A, 18B, and 18C are diagrams showing a configuration example of an image sensor in which FD sharing is combined with Case 3.
Figure 18B:
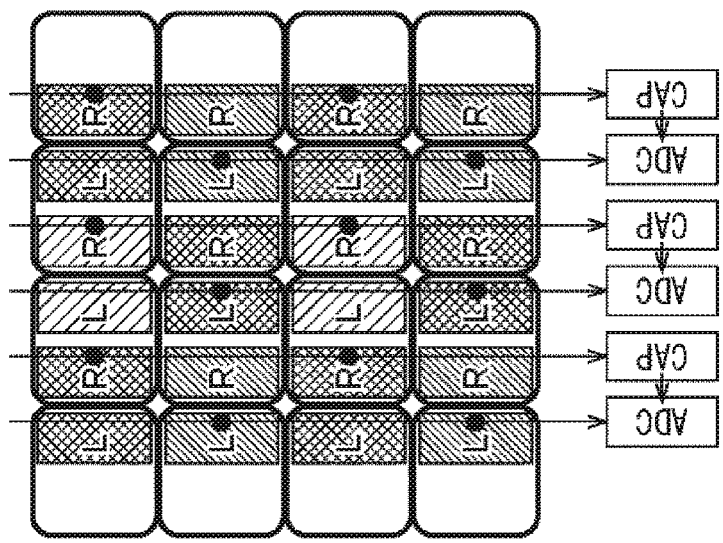
Figure 18C:
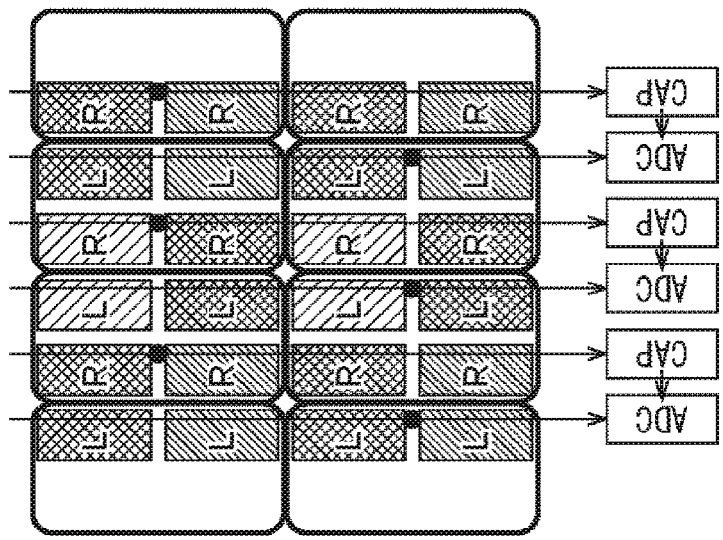

FIG. 18A is a configuration example of an image sensor in which the FD 1-pixel occupation is combined with Case 3 and one capacitance and one ADC are arranged for two columns. Hereinafter, it is called an image sensor 80. FIG. 18B is a configuration example of an image sensor in which the FD 2-pixel sharing is combined with Case 3 and one capacitance and one ADC are arranged for two columns. Hereinafter, it is called an image sensor 90. FIG. 18C is a configuration example of an image sensor in which the FD 4-pixel sharing is combined with Case 2 and one capacitance and one ADC are arranged for two columns. Hereinafter, it is called an image sensor 100.

Figure 19B:
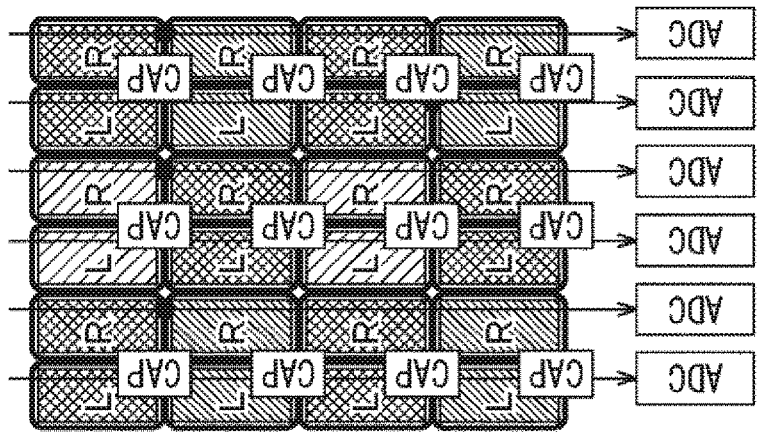
FIGS. 19A and 19B are diagrams showing another configuration example of an image sensor in which FD sharing is combined with Case 3.
Figure 19A:
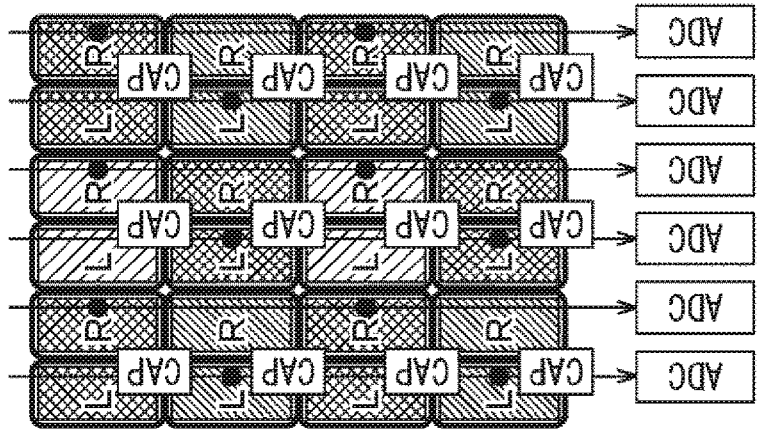

FIG. 19A is a configuration example of an image sensor in which a case of sharing an on-chip lens and an FD by two pixels is combined with Case 3 and a capacitance is arranged at one of the pixel pair and an ADC is arranged for every column. Hereinafter, it is called an image sensor 110. FIG. 19B is a configuration example of an image sensor in which a case of sharing an FD by two sets of a pixel pair that shares an on-chip lens is combined with Case 3, and a capacitance is arranged at one of the pixel pair and an ADC is arranged for every column. Hereinafter, it is called an image sensor 120.

FIG. 20 is a circuit diagram showing a configuration example of the image sensor 90 in which the FD 2-pixel sharing is combined with Case 3 and one capacitance and one ADC are arranged for two columns.

When attention is paid to two B (BLUE) pixels (PDs) that are arranged in the first row from the top on the left side in FIG. 20 and share an on-chip lens, a pixel pair 91 belongs to different FD sharing units and L of the pixel pair 91 is connected to the vertical signal line V1 via the switch TG_BL, an FD 92, and the switch SEL_1. To the vertical signal line V1, a capacitance 93 is connected, and, to the capacitance 93, an ADC 94 is connected via the switch RD_1. R of the pixel pair 91 is connected to the vertical signal line V3 via the switch TG_BR, an FD 95, and the switch SEL_1. To the vertical signal line V3, the ADC 94 that is shared by the vertical signal line V1 is connected via the switch RD_2.

In the image sensor 90 shown in FIG. 20, it is possible to read out simultaneously charges from L and R of the pixel pair 91 and to hold the charges that are read out from L of the pixel pair 91 in the capacitance 93, and to output the charges that are read out from R of the pixel pair 91, by simultaneously turning on the switches TG_BR, TG_BL and the switch SEL_1 in a state where the switch RD_1 is turned off and the switch RD_2 is turned on. Next, by turning on the switch RD_1 and turning off the switch RD_2, it is possible to output the charges that have been read out from L of the pixel pair 91 and held in the capacitance 93. Meanwhile, although illustration is omitted, it is also possible to add and output charges that have been read out from the pixel pair 91 by providing a switch that links the vertical signal lines V1 and V3.

FIG. 21 is a circuit diagram showing a configuration example of the image sensor 110 in which the FD 2-pixel sharing is combined with Case 3, a capacitance is arranged at one of the pixel pair and an ADC is arranged for every column.

When attention is paid to two B (BLUE) pixels (PDs) that are arranged in the first row from the top on the left side in FIG. 21 and share an on-chip lens and an FD, L of a pixel pair 111 is connected to the vertical signal line V1 via the switch TG_BL, a capacitance 112, the switch RD_1, an FD 113 and the switch SEL_1. An ADC 114 is connected to the vertical signal line V1. R of the pixel pair 111 is connected to the vertical signal line V1 via the switch TG_BR, the switch RD_2, the FD 113 and the switch SEL_1.

In the image sensor 110 shown in FIG. 21, it is possible to read out simultaneously charges from L and R of the pixel pair 111, and to hold the charges that have been read out from L of the pixel pair 111 in the capacitance 112 and to output the charges that have been read out from R of the pixel pair 111, by simultaneously turning on the switches TG_BR, TG_BL and the switch SEL_1 in a state where the switch RD_1 is turned off and the switch RD_2 is turned on. Next, by turning on the switch RD_1 and turning off the switch RD_2, it is possible to output the charges that have been read out from L of the pixel pair 111 and held in the capacitance 112. Meanwhile, it is also possible to add and output the charges that have been read out from the pixel pair 111.

<Conclusion>

According to the above-described image sensors 10 to 110, it is possible to make exposure times and their timings of a pixel pair that shares an on-chip lens coincide with each other and to output these outputs individually or after addition.

Meanwhile, in the present embodiment, it is so configured that an on-chip lens is shared by two PDs that are arranged laterally, but the number and arrangement of PDs that share an on-chip lens are not limited to this. For example, an on-chip lens may be shared by two PDs that are arranged vertically, or an on-chip lens may be shared by two PDs that are arranged vertically, or may be shared by three or more PDs.

Moreover, the present disclosure can also be applied to a case of providing an ADC for each pixel (PD).

<Use Examples of Image Sensor>

Figure 22:
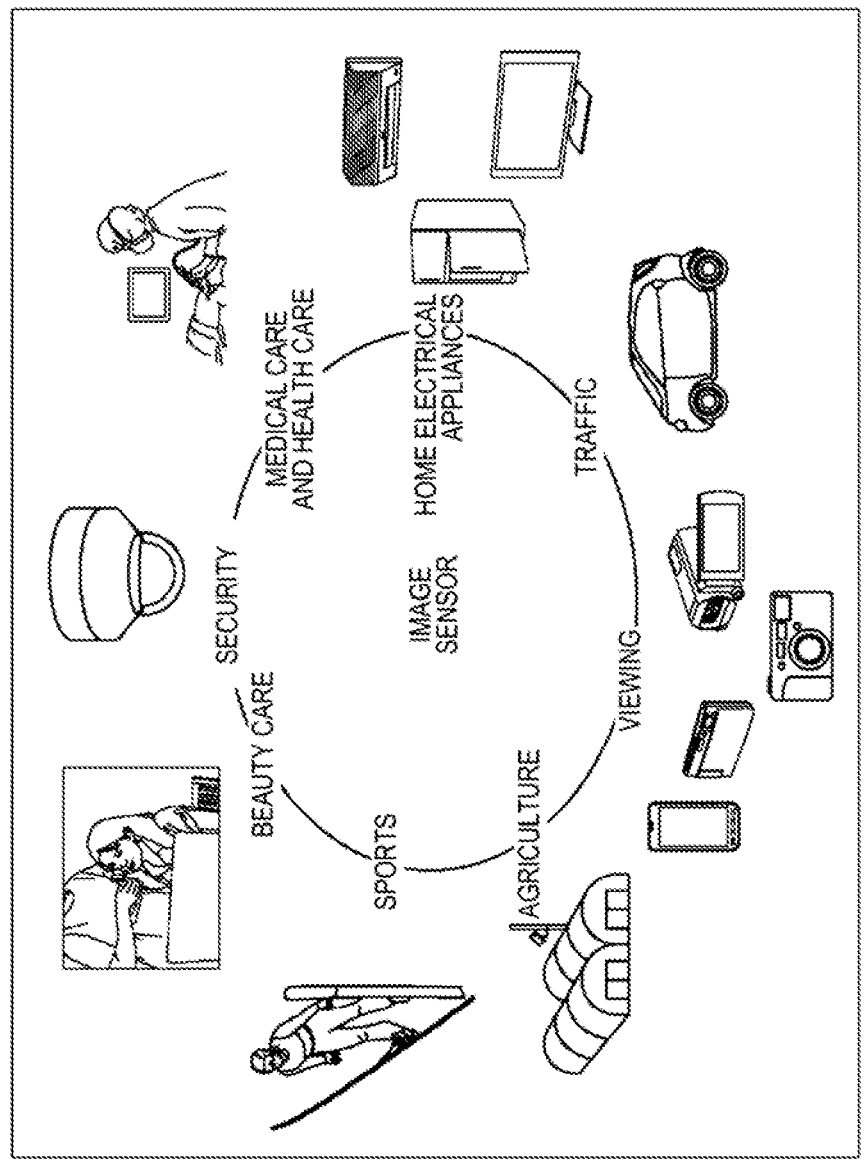
FIG. 22 is a diagram showing a use example of an electronic apparatus to which the present disclosure is applied.

FIG. 22 is a diagram illustrating use examples in which the above-described image sensor is used.

The above-described image sensor can be used for, for example, various cases in which light such as visible light, infrared light, ultraviolet light, or X-rays is detected as follows.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.
- Devices used for agriculture, such as a camera for monitoring the condition of the field and crops.

An embodiment of the disclosure is not limited to the embodiments described above, and various changes and modifications may be made without departing from the scope of the disclosure.

Additionally, the present technology may also be configured as below.

(1)

An image sensor including:

a light receiving element that generates charges by photoelectric conversion;

an on-chip lens that is shared by a plurality of light receiving elements and condenses incident light onto the plurality of light receiving elements; and an AD convertor that converts charges generated by the light receiving element to a digital signal, in which exposure timings of the plurality of light receiving elements sharing one of the on-chip lenses are the same.

(2)

The image sensor according to (1), further including:

an adder that adds charges that are generated by each of the plurality of light receiving elements sharing one of the on-chip lenses and supplies the added charges to the AD convertor.

(3)

The image sensor according to (1) or (2), in which charges that are generated by each of the plurality of light receiving elements sharing one of the on-chip lenses are converted simultaneously to digital signals by the AD convertors that are different.

(4)

The image sensor according to any of (1) to (3), in which the plurality of light receiving elements sharing one of the on-chip lenses belong to different FD sharing units.

(5)
The image sensor according to (4),
in which the AD convertor is provided for every column.
(6)
The image sensor according to (1) or (2), further including:
a plurality of holding units that hold charges generated by each of the plurality of light receiving elements sharing one of the on-chip lenses,
in which charges that are held in the plurality of holding units are converted sequentially to digital signals by the AD convertor in common.
(7)
The image sensor according to (6),
in which the plurality of light receiving elements sharing one of the on-chip lenses belong to different FD sharing units.
(8)
The image sensor according to (7), in which
the holding unit is provided for every column, and
the AD convertor is provided for every other column.
(9)
The image sensor according to (6),
in which the plurality of light receiving elements sharing one of the on-chip lenses belong to a same FD sharing unit.
(10)
The image sensor according to (9), in which
the holding unit is provided for every light receiving element, and
the AD convertor is provided for every column.
(11)
The image sensor according to (1) or (2), further including:
a holding unit that holds charges generated by the plurality of light receiving elements sharing one of the on-chip lenses,
in which charges generated by each of the plurality of light receiving elements sharing one of the on-chip lenses and charges held in the holding unit are converted sequentially to digital signals by the AD convertor in common.
(12)
The image sensor according to (1), (2), or (11), further including:
a holding unit that holds charges generated by one of a light receiving element pair sharing one of the on-chip lenses,
in which charges generated by one of the light receiving element pair, and charges generated by the other of the light receiving element pair and held in the holding unit are converted sequentially to digital signals by the AD convertor in common.
(13)
The image sensor according to (12),
in which the plurality of light receiving elements sharing one of the on-chip lenses belong to different FD sharing units.
(14)
The image sensor according to (13), in which
the holding unit is provided for every other column, and
the AD convertor is provided for every other column.
(15)
The image sensor according to (14),
in which the plurality of light receiving elements sharing one of the on-chip lenses belong to the same FD sharing unit.

(16)
The image sensor according to (15), in which
the holding unit is provided for every FD sharing unit, and
the AD convertor is provided for every column.
(17)
An electronic device on which an image sensor is mounted,
the image sensor including
a light receiving element that generates charges by photoelectric conversion,
an on-chip lens that is shared by a plurality of light receiving elements and condenses incident light onto the plurality of light receiving elements, and
an AD convertor that converts charges generated by the light receiving element to a digital signal,
in which exposure timings of the plurality of light receiving elements sharing one of the on-chip lenses are the same.

REFERENCE SIGNS LIST 10 image sensor
20 image sensor
21 pixel pair
22 FD
23 ADC
24 FD
25 ADC
30 image sensor
40 image sensor
41 pixel pair
42 FD
43 capacitance
44 ADC
45 FD
46 capacitance
50 image sensor
60 image sensor
70 image sensor
80 image sensor
90 image sensor
91 pixel pair
92 FD
93 capacitance
94 ADC
95 FD
100 image sensor
110 image sensor
111 pixel pair
112 capacitance
113 FD
114 ADC
115 ADC
120 image sensor

The invention claimed is:
1. An image sensor, comprising:
a plurality of light receiving elements, wherein each light receiving element of the plurality of light receiving elements is configured to generate charges based on photoelectric conversion;
a plurality of on-chip lenses,
wherein the plurality of light receiving elements shares one on-chip lens of the plurality of on-chip lenses;
a plurality of floating diffusion (FD) sharing units,
wherein each light receiving element of the plurality of light receiving elements corresponds to a different FD sharing unit of the plurality of FD sharing units; and a plurality of analog-digital (AD) convertors configured to convert the charges generated by the plurality of light receiving elements to a plurality of digital signals,
wherein an exposure timing of each light receiving element of the plurality of light receiving elements is same.

2. The image sensor according to claim 1, further comprising:
an adder configured to:
add the charges generated by each light receiving element of the plurality of light receiving elements; and
supply the added charges to at least one AD convertor of the plurality of AD convertors.

3. The image sensor according to claim 1,
wherein each AD convertor of the plurality of AD convertors is further configured to concurrently convert the charges generated by each light receiving element of the plurality of light receiving elements to a corresponding digital signal of the plurality of digital signals.

4. The image sensor according to claim 3, wherein
the plurality of light receiving elements is in a plurality of columns, and
each AD convertor of the plurality of AD convertors is associated with a corresponding column of the plurality of columns.

5. The image sensor according to claim 1, further comprising:
a plurality of holding units configured to hold the charges generated by each light receiving element of the plurality of light receiving elements, wherein
each light receiving element of the plurality of light receiving elements is associated with a common AD convertor of the plurality of AD convertors, and
the common AD convertor is configured to concurrently convert the charges generated by each light receiving element of the plurality of light receiving elements to a corresponding digital signal of the plurality of digital signals.

6. The image sensor according to claim 5, wherein
the plurality of light receiving elements is in a plurality of columns,
each column of the plurality of columns has a corresponding holding unit of the plurality of holding units, and
each alternate column of the plurality of columns has a corresponding AD convertor of the plurality of AD convertors.

7. The image sensor according to claim 5, wherein
the plurality of light receiving elements is in a plurality of columns,
each holding unit of the plurality of holding units is associated with a corresponding light receiving element of the plurality of light receiving elements, and
each AD convertor of the plurality of AD convertors is associated with a corresponding column of the plurality of columns.

8. The image sensor according to claim 1, further comprising:
a holding unit configured to hold the charges generated by each light receiving element of the plurality of light receiving elements, wherein
each light receiving element of the plurality of light receiving elements is associated with a common AD convertor of the plurality of AD convertors, and
the common AD convertor is configured to concurrently convert the charges generated by each light receiving element of the plurality of light receiving elements to a corresponding digital signal of the plurality of digital signals.

9. The image sensor according to claim 1, further comprising
a plurality of holding units, wherein
the plurality of light receiving elements includes a pair of light receiving elements,
a holding unit of the plurality of holding units is configured to hold the charges generated by one of the pair of light receiving elements,
each light receiving element of the pair of light receiving elements is associated with a common AD convertor of the plurality of AD convertors, and
the common AD convertor is configured to concurrently convert the charges generated by other of the pair of light receiving elements and the charges held in the holding unit to a corresponding digital signal of the plurality of digital signals.

10. The image sensor according to claim 9, wherein
the plurality of light receiving elements is in a plurality of columns, and
the plurality of holding units and the plurality of AD convertors are alternately arranged for the plurality of columns.

11. The image sensor according to claim 10, wherein
each holding unit of the plurality of holding units is associated with a corresponding FD sharing unit of the plurality of FD sharing units.

12. An electronic device, comprising:
an image sensor that includes:
a plurality of light receiving elements, wherein each light receiving element of the plurality of light receiving elements is configured to generate charges based on photoelectric conversion;
a plurality of on-chip lenses,
wherein a the plurality of light receiving elements shares one on-chip lens of the plurality of on-chip lenses;
a plurality of floating diffusion (FD) sharing units,
wherein each light receiving element of the plurality of light receiving elements corresponds to a different FD sharing unit of the plurality of FD sharing units; and
a plurality of analog-digital AD convertors configured to convert the charges generated by the plurality of light receiving elements to a digital signal,
wherein an exposure timing of each light receiving element of the plurality of light receiving elements is same.

* * * * *